United States Patent
Kamikawa et al.

(10) Patent No.: US 8,567,417 B2
(45) Date of Patent: Oct. 29, 2013

(54) ULTRASONIC CLEANING APPARATUS, ULTRASONIC CLEANING METHOD, AND STORAGE MEDIUM STORING COMPUTER PROGRAM FOR EXECUTING ULTRASONIC CLEANING METHOD

(75) Inventors: Yuji Kamikawa, Koshi (JP); Hiroaki Inadomi, Koshi (JP); Hideyuki Yamamoto, Koshi (JP); Hiroshi Komiya, Koshi (JP); Koji Egashira, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 352 days.

(21) Appl. No.: 12/896,029

(22) Filed: Oct. 1, 2010

(65) Prior Publication Data

US 2011/0079240 A1    Apr. 7, 2011

(30) Foreign Application Priority Data

Oct. 5, 2009 (JP) ................................. 2009-231668
Mar. 25, 2010 (JP) ................................. 2010-070506
Aug. 3, 2010 (JP) ................................. 2010-174604

(51) Int. Cl.
*B08B 3/12* (2006.01)

(52) U.S. Cl.
USPC .................... 134/66; 134/1; 134/56 R; 134/61

(58) Field of Classification Search
CPC .................... H01L 21/67781; H01L 21/67313
USPC .................... 414/935–941; 134/66
See application file for complete search history.

(56) References Cited

U.S. PATENT DOCUMENTS

| | | | |
|---|---|---|---|
| 5,656,088 A * | 8/1997 | Sugimoto et al. | 118/423 |
| 6,068,002 A * | 5/2000 | Kamikawa et al. | 134/66 |
| 6,368,040 B1 * | 4/2002 | Yamasaki et al. | 414/225.01 |
| 6,540,468 B1 * | 4/2003 | Blattner et al. | 414/416.08 |
| 6,589,386 B1 | 7/2003 | Maeda et al. | |
| 7,108,003 B2 | 9/2006 | Kitahara | |
| 2007/0147979 A1 * | 6/2007 | Rice et al. | 414/744.1 |
| 2007/0267040 A1 * | 11/2007 | Watanabe et al. | 134/1 |

FOREIGN PATENT DOCUMENTS

| | | |
|---|---|---|
| JP | 06-112184 A1 | 4/1994 |
| JP | 03-045636 U1 * | 2/1998 |
| JP | 2000-183134 A1 | 6/2000 |
| JP | 2003-209086 A1 | 7/2003 |
| JP | 2006-324495 A1 | 11/2006 |

OTHER PUBLICATIONS

Japanese Office Action dated Jul. 26, 2013.

* cited by examiner

*Primary Examiner* — Michael Kornakov
*Assistant Examiner* — Marc Lorenzi
(74) *Attorney, Agent, or Firm* — Burr & Brown

(57) ABSTRACT

An ultrasonic cleaning apparatus including: a cleaning tank for storing a cleaning liquid; an object-to-be-processed holder for insertion into the cleaning tank, the holder holding an object to be processed and immersing the object into the cleaning liquid; a vibrator disposed on a bottom part of the cleaning tank; and an ultrasonic oscillator configured to make the vibrator ultrasonically vibrate. In the cleaning tank, a lateral holding member configured to hold the object is disposed. The holder is configured to be laterally moved by a driving apparatus. The control device is configured to control the driving apparatus such that the holder is laterally moved after the object has been held by the lateral holding member, and the control device is configured to control the ultrasonic oscillator such that the vibrator is made to ultrasonically vibrate so that the ultrasonic vibration from the vibrator is propagated to the object.

6 Claims, 13 Drawing Sheets

122a,122b,123a,123b 121a,121b

ULTRASONIC CLEANING APPARATUS, ULTRASONIC CLEANING METHOD, AND STORAGE MEDIUM STORING COMPUTER PROGRAM FOR EXECUTING ULTRASONIC CLEANING METHOD

CROSS REFERENCE TO RELATED APPLICATIONS

This application is based upon and claims the benefit of priority from the prior Japanese Patent Application No. 2009-231668 filed on Oct. 5, 2009, Japanese Patent Application No. 2010-070506 filed on Mar. 25, 2010, and Japanese Patent Application No. 2010-174604 filed on Aug. 3, 2010, the entire contents of which are incorporated herein by reference.

BACKGROUND OF TINE INVENTION

1. Field of the Invention

The present invention relates to: an ultrasonic cleaning apparatus configured to clean an object to be processed, which is immersed in a cleaning liquid, with the use of ultrasonic waves; an ultrasonic cleaning method; and a storage medium storing a computer program for executing the ultrasonic cleaning method.

2. Description of Related Art

There has been conventionally known an ultrasonic cleaning apparatus configured to perform an ultrasonic cleaning (including a megasonic cleaning) of an object to be processed, such as a semiconductor wafer or a glass substrate for LCD, by using ultrasonic waves, with the object to be processed being immersed in a cleaning liquid such as a deionized water or a chemical liquid stored in a cleaning tank (see, JP2003-209086A, for example). In the ultrasonic cleaning apparatus, a vibrator capable of generating ultrasonic vibration is attached to a bottom part of the cleaning tank, and an ultrasonic oscillator that makes the vibrator ultrasonically vibrate is connected to the vibrator.

When an object to be processed is cleaned in such an ultrasonic cleaning apparatus, the vibrator is made to ultrasonically vibrate by the ultrasonic oscillator, with the object to be processed being immersed in the cleaning liquid in the cleaning tank. Thus, the ultrasonic vibration is propagated to the cleaning liquid, so that ultrasonic waves are radiated from below to the object to be processed. Therefore, particles adhering to the object to be processed are removed. In this manner, the object to be processed is ultrasonically cleaned.

SUMMARY OF THE INVENTION

When the object to be processed is ultrasonically cleaned in such an ultrasonic cleaning apparatus, the object to be processed is held by a wafer board. In this case, since there is a holding rod of the wafer board below the object to be processed, ultrasonic vibration propagated from below is blocked by the holding rod of the wafer board. Namely, since the ultrasonic vibration propagated from the vibrator is likely to move rectilinearly, it is difficult for the ultrasonic vibration to be propagated to an area of the object to be processed, which is above the holding rod of the wafer board. Thus, there occurs a problem in that it is difficult to ultrasonically clean all the areas of the object to be processed uniformly.

The present invention has been made in view of the above circumstances. The object of the present invention is to provide an ultrasonic cleaning apparatus capable of uniformly cleaning the overall area of an object to be processed, an ultrasonic cleaning method, and a storage medium storing a computer program for executing the ultrasonic cleaning method.

As a first solution, the present invention provides an ultrasonic cleaning apparatus comprising: a cleaning tank configured to store a cleaning liquid; an object-to-be-processed holder that can be inserted into the cleaning tank, the object-to-be-processed holder being configured to hold an object to be processed and to immerse the object to be processed into the cleaning liquid; a vibrator disposed on a bottom part of the cleaning tank; an ultrasonic oscillator configured to make the vibrator ultrasonically vibrate; a lateral holding member disposed in the cleaning tank, the lateral holding member being configured to hold the object to be processed; a driving apparatus configured to laterally move the object-to-be-processed holder; and a control device configured to control the ultrasonic oscillator and the driving apparatus; wherein the control device is configured to control the driving apparatus such that, after the object to be processed has been held by the lateral holding member, the object-to-be-processed holder is laterally moved, and the control device is configured to control the ultrasonic oscillator such that the vibrator is made to ultrasonically vibrate so that the ultrasonic vibration from the vibrator is propagated to the object to be processed.

In the aforementioned ultrasonic cleaning apparatus by the first solution, the lateral holding member may be configured to receive the object to be processed from the object-to-be-processed holder and to hold the object to be processed, the driving apparatus may be configured to move the object-to-be-processed holder from a holding position at which the object to be processed is held, to a lateral position located laterally to the holding position, and the control device may be configured to control the ultrasonic oscillator and the driving apparatus such that, after the object to be processed has been transferred from the object-to-be-processed holder to the lateral holding member, the vibrator is made to ultrasonically vibrate when the object-to-be-processed holder is moved from the holding position to the lateral position so that the object-to-be-processed holder is located at least at the lateral position, whereby the ultrasonic vibration from the vibrator is propagated to an area of the object to be processed, the area having been held by the object-to-be-processed holder. In this case, the object to be processed, which is immersed in the cleaning liquid in the cleaning tank and is held by the object-to-be-processed holder, is transferred to the lateral holding member disposed in the cleaning tank. Then, when the object-to-be-processed holder is moved from the holding position to the lateral position so that the object-to-be-processed holder is located at least at the lateral position, the control device makes the vibrator ultrasonically vibrate. Thus, the ultrasonic vibration from the vibrator can be propagated to the area of the object to be processed, which is to be held by the object-to-be-processed holder. Thus, all the areas of the object to be processed can be ultrasonically cleaned uniformly.

In the aforementioned ultrasonic cleaning apparatus by the first solution, the object-to-be-processed holder may include a pair of object-to-be-processed holding parts configured to hold the object to be processed, and the respective object-to-be-processed holding parts can be moved separately from each other.

In the aforementioned ultrasonic cleaning apparatus by the first solution, the pair of object-to-be-processed holding parts may be configured to be moved substantially symmetrically with respect to the object to be processed.

In the aforementioned ultrasonic cleaning apparatus by the first solution, the control device may be configured to control the ultrasonic oscillator and the driving apparatus such that the object-to-be-processed holder is moved from the holding position to a lowered position located below the holding position and is then moved from the lowered position to the lateral position, and that the vibrator is also made to ultrasonically vibrate while the object-to-be-processed holder is being moved from the lowered position to the lateral position.

In the aforementioned ultrasonic cleaning apparatus by the first solution, the control device may be configured to control the ultrasonic oscillator and the driving apparatus such that the object-to-be-processed holder is moved from the lateral position to the lowered position, and that the vibrator is also made to ultrasonically vibrate while the object-to-be-processed holder is being moved from the lateral position to the lowered position.

In the aforementioned ultrasonic cleaning apparatus by the first solution, the lateral holding member may be configured to be moved between a transfer position at which the object to be processed is received and held, and a withdrawn position that is withdrawn from the object to be processed to be away therefrom.

In the aforementioned ultrasonic cleaning apparatus by the first solution, the lateral holding member may include a pair of pinching parts configured to come into contact with a side surface of the object to be processed so as to pinch the object to be processed therebetween.

In the aforementioned ultrasonic cleaning apparatus by the first solution, the lateral holding member may be configured to receive the object to be processed from the object-to-be-processed holder and to hold the object to be processed, the driving apparatus may be configured to move the object-to-be-processed holder from a holding position at which the object to be processed is held, to a lateral position located laterally to the holding position, the object-to-be-processed holder may include a pair of object-to-be-processed holding parts configured to hold the object to be processed, and the control device may be configured to control the ultrasonic oscillator and the driving apparatus such that, after the object to be processed has been transferred from the object-to-be-processed holder to the lateral holding member, the vibrator is made to ultrasonically vibrate when at least one of the object-to-be-processed holding parts of the object-to-be-processed holder is moved from the holding position to the lateral position so that the one object-to-be-processed holding part is located at least at the lateral position, whereby the ultrasonic vibration from the vibrator is propagated to an area of the object to be processed, the area having been held by the one object-to-be-processed holding part. In this case, the object to be processed, which is immersed in the cleaning liquid in the cleaning tank and is held by the object-to-be-processed holder, is transferred to the lateral holding member disposed in the cleaning tank. Then, when at least one of the object-to-be-processed holding part of the object-to-be-processed holder is moved from the holding position to the lateral position so that the one object-to-be-processed holding part is located at least at the lateral position, the control device makes the vibrator ultrasonically vibrate. Thus, the ultrasonic vibration from the vibrator can be propagated to the area of the object to be processed, which is to be held by the one object-to-be-processed holding part. Therefore, all the areas of the object to be processed can be ultrasonically cleaned uniformly.

In the aforementioned ultrasonic cleaning apparatus by the first solution, the object-to-be-processed holder may include a first object-to-be-processed holding part and a second object-to-be-processed holding part which can be moved separately from each other, the driving apparatus may be configured to move the first object-to-be-processed holding part of the object-to-be-processed holder from a first holding position at which the object to be processed is held, to a first lateral position located laterally to the first holding position, and to move the second object-to-be-processed holding part from a second holding position at which the object to be processed is held, to a second lateral position located laterally to the second holding position, and the control device may be configured to control the driving apparatus such that, after the object to be processed has been held by the lateral holding member and the first object-to-be-processed holding part, the second object-to-be-processed holding part of the object-to-be-processed holder is moved from the second holding position to the second lateral position and is then returned to the second holding position, and that, after the object to be processed has been hold by the lateral holding member and the second object-to-be-processed holding part, the first object-to-be-processed holding part is moved from the first holding position to the first lateral position and is then returned to the first holding position, and the control device is configured to control the ultrasonic oscillator such that the vibrator is made to ultrasonically vibrate when the first object-to-be-processed holding part is located at least at the first lateral position and when the second object-to-be-processed holding part is located at least at the second lateral position, whereby the ultrasonic vibration from the vibrator is propagated to areas of the object to be processed, the areas having been held by the first object-to-be-processed holding part and the second object-to-be-processed holding part. In this case, with the object to be processed, which is immersed in the cleaning liquid in the cleaning tank and is held by the object-to-be-processed holder, being held by the lateral holding member disposed in the cleaning tank and the first object-to-be-processed holding part, the second object-to-be-processed holding part of the object-to-be-processed holder is moved from the second holding position to the second lateral position, and is then returned to the second holding position. Further, the first object-to-be-processed holding part is moved from the first holding position to the first lateral position, and is then returned to the first holding position. When the first object-to-be-processed holding part is located at least at the first lateral position and when the second object-to-be-processed holding part is located at least at the second lateral position, the control device makes the vibrator ultrasonically vibrate. Thus, the ultrasonic vibration from the vibrator can be propagated to the areas of the object to be processed, which are to be held by the first object-to-be-processed holding part and the second object-to-be-processed holding part. Therefore, all the areas of the object to be processed can be ultrasonically cleaned uniformly.

In addition, as a second solution, the present invention provides an ultrasonic cleaning apparatus comprising: a cleaning tank configured to store a cleaning liquid; an object-to-be-processed holder that can be inserted into the cleaning tank, the object-to-be-processed holder being configured to hold an object to be processed and to immerse the object to be processed into the cleaning liquid; a vibrator disposed on a bottom part of the cleaning tank; an ultrasonic oscillator configured to make the vibrator ultrasonically vibrate; a driving apparatus configured to laterally move the object-to-be-processed holder; and a control device configured to control the ultrasonic oscillator and the driving apparatus; wherein the object-to-be-processed holder includes a first object-to-be-processed holding part and a second object-to-be-processed holding part which can be moved separately from each other, each of the first object-to-be-processed holding part and the second object-to-be-processed holding part includes a first holding rod and a second holding rod arranged opposedly to the first holding rod with respect to a vertical axis line passing a center of the object to be processed, the second holding rod of the first object-to-be-processed holding part is disposed between the first holding rod of the second object-to-be-processed holding part and the second holding rod of the second object-to-be-processed holding part, the first object-to-be-processed holding part and the second object-to-be-processed holding part can hold the object to be processed independently from each other, and the control device is configured to control the driving apparatus such that the first object-to-be-processed holding part and the second object-to-be-processed holding part of the object-to-be-processed holder are sequentially laterally moved, and the control device is configured to control the ultrasonic oscillator such that the vibrator is made to ultrasonically vibrate whereby the ultrasonic vibration from the vibrator is propagated to the object to be processed.

In the aforementioned ultrasonic cleaning apparatus by the second solution, the control device may be configured to control the driving apparatus such that, after the object to be processed held by the first object-to-be-processed holding part and the second object-to-be-processed holding part has been immersed into the cleaning liquid in the cleaning tank, the first object-to-be-processed holding part is moved from a first holding position at which the object to be processed is held, to a first lateral position located laterally to the first holding position and is then returned to the first holding position, and that the second object-to-be-processed holding part is moved from a second holding position at which the object to be processed is held, to a second lateral position located laterally to the second holding position and is then returned to the second holding position, and the control device is configured to control the ultrasonic oscillator such that the vibrator is made to ultrasonically vibrate when the first object-to-be-processed holding part is located at least at the first lateral position and when the second object-to-be-processed holding part is located at least at the second lateral position, whereby the ultrasonic vibration from the vibrator is propagated to areas of the object to be processed, the areas having been held by the first object-to-be-processed holding part and the second object-to-be-processed holding part.

In the aforementioned ultrasonic cleaning apparatus by the second solution, each of the first object-to-be-processed holding part and the second object-to-be-processed holding part may include a third holding rod disposed between the first holding rod and the second holding rod, the third holding rod being configured to hold the object to be processed together with the first holding rod and the second holding rod.

In the aforementioned ultrasonic cleaning apparatus by the second solution, the third holding rod of the first object-to-be-processed holding part may be disposed between the first holding rod of the first object-to-be-processed holding part and the second holding rod of the second object-to-be-processed holding part, and the third holding rod of the second object-to-be-processed holding part may be disposed between the first holding rod of the second object-to-be-processed holding part and the second holding rod of the first object-to-be-processed holding part.

In the aforementioned ultrasonic cleaning apparatus by the second solution, the second holding rods and the third holding rods of the first object-to-be-processed holding part and of the second object-to-be-processed holding part may be provided with V-shaped grooves each having a V-shaped cross-section engageable with the object to be processed, and the first holding rods of the first object-to-be-processed holding part and of the second object-to-be-processed holding part may be provided with Y-shaped grooves each having a Y-shaped cross-section engageable with the object to be processed.

In the aforementioned ultrasonic cleaning apparatus by the second solution, the control device may be configured to control the driving apparatus such that, when the first object-to-be-processed holding part is moved between the first holding position and the first lateral position, the first object-to-be-processed holding part passes through a first lowered position located below the first holding position, and that, when the second object-to-be-processed holding part is moved between the second holding position and the second lateral position, the second object-to-be-processed holding part passes through a second lowered position located below the second holding position.

In the aforementioned ultrasonic cleaning apparatus by the second solution, the control device may be configured to control the ultrasonic oscillator such that the vibrator is also made to ultrasonically vibrate, while the first object-to-be-processed holding part is being moved between the first lowered position and the first lateral position, and while the second object-to-be-processed holding part is moved between the second lowered position and the second lateral position.

In addition, as a second solution, the present invention provides an ultrasonic cleaning method comprising: making an object to be processed, which is held by an object-to-be-processed holder and is immersed in a cleaning liquid in a cleaning tank, be held by a lateral holding member disposed in the cleaning tank; laterally moving the object-to-be-processed holder; and making a vibrator, which is disposed on a bottom part of the cleaning tank, ultrasonically vibrate so as to ultrasonically clean the object to be processed; wherein lateral movement of the object-to-be-processed holder and the ultrasonic cleaning of the object to be processed are performed after the object to be processed has been held by the lateral holding member.

In the aforementioned ultrasonic cleaning method by the third solution, when the object to be processed is made to be held by the lateral holding member, the object to be processed held by the object-to-be-processed holder may be transferred to the lateral holding member, when the object-to-be-processed holder is laterally moved, the object-to-be-processed holder may be moved from a holding position at which the object to be processed is held, to a lateral position located laterally to the holding position, and when the object-to-be-processed holder is located at least at the lateral position, the ultrasonic vibration from the vibrator may be propagated to an area of the object to be processed, the area having been held by the object-to-be-processed holder. In this case, the object to be processed, which is immersed in the cleaning liquid in the cleaning tank and is held by the object-to-be-processed holder, is transferred to the lateral holding member disposed in the cleaning tank. Then, when the object-to-be-processed holder is moved from the holding position to the lateral position so that the object-to-be-processed holder is located at least at the lateral position, the control device makes the vibrator ultrasonically vibrate. Thus, the ultrasonic vibration from the vibrator can be propagated to the area of the object to be processed, which is to be held by the object-to-be-processed holder. Thus, all the areas of the object to be processed can be ultrasonically cleaned uniformly.

In the aforementioned ultrasonic cleaning method by the third solution, the object-to-be-processed holder may include a pair of object-to-be-processed holding parts configured to hold the object to be processed, and the respective object-to-be-processed holding parts can be moved separately from each other.

In the aforementioned ultrasonic cleaning method by the third solution, the pair of object-to-be-processed holding parts may be configured to be moved substantially symmetrically with respect to the object to be processed.

In the aforementioned ultrasonic cleaning method by the third solution, when the object-to-be-processed holder is laterally moved, the object-to-be-processed holder may be moved from the holding position to a lowered position located below the holding position, and is then moved from the lowered position to the lateral position, and the vibrator may be also made to ultrasonically vibrate while the object-to-be-processed holder is being moved from the lowered position to the lateral position.

In the aforementioned ultrasonic cleaning method by the third solution, the ultrasonic cleaning method may further comprises moving the object-to-be-processed holder from the lateral position to the lowered position, wherein the vibrator is also made to ultrasonically vibrate while the object-to-be-processed holder is being moved from the lateral position to the lowered position.

In the aforementioned ultrasonic cleaning method by the third solution, when the object to be processed is made to be held by the lateral holding member, the lateral holding member may be moved from a withdrawn position withdrawn from the object to be processed to be away therefrom, to a transfer position at which the object to be processed is received and held, so as to hold the object to be processed.

In the aforementioned ultrasonic cleaning method by the third solution, the lateral holding member may include a pair of pinching parts configured to come into contact with a side surface of the object to be processed so as to pinch the object to be processed therebetween, and when the object to be processed is made to be held by the lateral holding member, the pinching parts may come into contact with the side surface of the object to be processed so as to pinch the object to be processed therebetween so that the lateral holding member holds the object to be processed.

In the aforementioned ultrasonic cleaning method by the third solution, the object-to-be-processed holder may include a pair of object-to-be-processed holding parts configured to hold the object to be processed, when the object to be processed is made to be held by the lateral holding member, the object to be processed held by the object-to-be-processed holder may be transferred to the lateral holding member, when the object-to-be-processed holder is laterally moved, at least one of the object-to-be-processed holding parts of the object-to-be-processed holder may be moved from a holding position at which the object to be processed is held, to a lateral position located laterally to the holding position, and when the one object-to-be-processed holding part of the object-to-be-processed holder is located at least at the lateral position, the ultrasonic vibration from the vibrator may be propagated to an area of the object to be processed, the area having been held by the one object-to-be-processed holding part. In this case, the object to be processed, which is immersed in the cleaning liquid in the cleaning tank and is held by the object-to-be-processed holder, is transferred to the lateral holding member disposed in the cleaning tank. Then, when at least one of the object-to-be-processed holding part of the object-to-be-processed holder is moved from the holding position to the lateral position so that the one object-to-be-processed holding part is located at least at the lateral position, the control device makes the vibrator ultrasonically vibrate. Thus, the ultrasonic vibration from the vibrator can be propagated to the area of the object to be processed, which is to be held by the one object-to-be-processed holding part. Therefore, all the areas of the object to be processed can be ultrasonically cleaned uniformly.

In the aforementioned ultrasonic cleaning method by the third solution, the object-to-be-processed holder may include a first object-to-be-processed holding part and a second object-to-be-processed holding part which can be moved separately from each other, when the object-to-be-processed holder is laterally moved, after the object to be processed has been made to be held by the lateral holding member and the first object-to-be-processed holding part, the second object-to-be-processed holding part of the object-to-be-processed holder may be moved from a second holding position at which the object to be processed is held, to a second lateral position located laterally to the second holding position and may be then returned to the second holding position, and after the object to be processed has been made to be held by the lateral holding member and the second object-to-be-processed holding part, the first object-to-be-processed holding part may be moved from a first holding position at which the object to be processed, to a first lateral position located laterally to the first holding position, and may be then returned to the first holding position, and when the first object-to-be-processed holding part is located at least at the first lateral position and when the second object-to-be-processed holding part is located at least at the second lateral position, the ultrasonic vibration from the vibrator may be propagated to areas of the object to be processed, the areas having been held by the first object-to-be-processed holding part and the second object-to-be-processed holding part. In this case, with the object to be processed, which is immersed in the cleaning liquid in the cleaning tank and is held by the object-to-be-processed holder, being held by the lateral holding member disposed in the cleaning tank and the first object-to-be-processed holding part, the second object-to-be-processed holding part of the object-to-be-processed holder is moved from the second holding position to the second lateral position, and is then returned to the second holding position. Further, the first object-to-be-processed holding part is moved from the first holding position to the first lateral position, and is then returned to the first holding position. When the first object-to-be-processed holding part is located at least at the first lateral position and when the second object-to-be-processed holding part is located at least at the second lateral position, the control device makes the vibrator ultrasonically vibrate. Thus, the ultrasonic vibration from the vibrator can be propagated to the areas of the object to be processed, which are to be held by the first object-to-be-processed holding part and the second object-to-be-processed holding part. Therefore, all the areas of the object to be processed can be ultrasonically cleaned uniformly.

In addition, as a fourth solution, the present invention provides an ultrasonic cleaning apparatus comprising: immersing an object to be processed, which is held by a first object-to-be-processed holding part and a second object-to-be-processed holding part of an object-to-be-processed holder, into a cleaning liquid in a cleaning tank; laterally moving the first object-to-be-processed holding part, with the object to be processed being held by the second object-to-be-processed holding part; and making a vibrator, which is disposed on a bottom part of the cleaning tank, ultrasonically vibrate so as to ultrasonically clean the object to be processed.

In the aforementioned ultrasonic cleaning method by the fourth solution, the ultrasonic cleaning method may further comprises moving the second object-to-be-processed holding part with the object to be processed being held by the first object-to-be-processed holding part, which is performed after the first object-to-be-processed holding part has been moved.

In the aforementioned ultrasonic cleaning method by the fourth solving means, when the first object-to-be-processed holding part is moved, the first object-to-be-processed holding part may be moved from a first holding position at which the object to be processed is held, to a first lateral position located laterally to the first holding position, and may be returned to the first holding position, and when the second object-to-be-processed holding part is moved, the second object-to-be-processed holding part may be moved from a second holding position at which the object to be processed is held, to a second lateral position located laterally to the second holding position, and may be then returned to the second holding position.

In the aforementioned ultrasonic cleaning method by the fourth solving means, the ultrasonic cleaning may be performed when the first object-to-be-processed holding part is located at least at the first lateral position and when the second object-to-be-processed holding part is located at least at the second lateral position, whereby the ultrasonic vibration from the vibrator is propagated to areas of the object to be processed, the areas having been held by the first object-to-be-processed holding part and the second object-to-be-processed holding part.

In the aforementioned ultrasonic cleaning method by the fourth solving means, when the first object-to-be-processed holding part is moved, the first object-to-be-processed holding part may pass through a first lowered position located below the first holding position, and when the second object-to-be-processed holding part is moved, the second object-to-be-processed holding part may pass through a second lowered position located below the second holding position.

In the aforementioned ultrasonic cleaning method by the fourth solving means, the ultrasonic cleaning may be also performed while the first object-to-be-processed holding part is being moved between the first lowered position and the first lateral position, and while the second object-to-be-processed holding part is being moved between the second lowered position and the second lateral position.

In addition, as a fifth solution, the present invention provides a storage medium storing a computer program for executing an ultrasonic cleaning method, the ultrasonic cleaning method comprising: making an object to be processed, which is held by an object-to-be-processed holder and is immersed in a cleaning liquid in a cleaning tank, be held by a lateral holding member disposed in the cleaning tank; laterally moving the object-to-be-processed holder; and making a vibrator, which is disposed on a bottom part of the cleaning tank, ultrasonically vibrate so as to ultrasonically clean the object to be processed; wherein lateral movement of the object-to-be-processed holder and the ultrasonic cleaning of the object to be processed are performed after the object to be processed has been held by the lateral holding member.

Further, as a sixth solution, the present invention provides a storage medium storing a computer program for executing an ultrasonic cleaning method, the ultrasonic cleaning method comprising: immersing an object to be processed, which is held by a first object-to-be-processed holding part and a second object-to-be-processed holding part of an object-to-be-processed holder, into a cleaning liquid in a cleaning tank; laterally moving the first object-to-be-processed holding part, with the object to be processed being held by the second object-to-be-processed holding part; and making a vibrator, which is disposed on a bottom part of the cleaning tank, ultrasonically vibrate so as to ultrasonically clean the object to be processed.

According to the present invention, all the areas of the object to be processed can be ultrasonically cleaned uniformly.

DETAILED DESCRIPTION OF THE INVENTION

First Embodiment

A first embodiment of the present invention will be described herebelow with reference to the drawings. FIGS. 1 to 14 are views explaining an ultrasonic cleaning apparatus in the first embodiment, an ultrasonic cleaning method in the first embodiment, and a storage medium storing a computer program for executing the ultrasonic cleaning method.

At first, an overall structure of the ultrasonic cleaning apparatus 1 is described with reference to FIG. 1.

Figure 1:
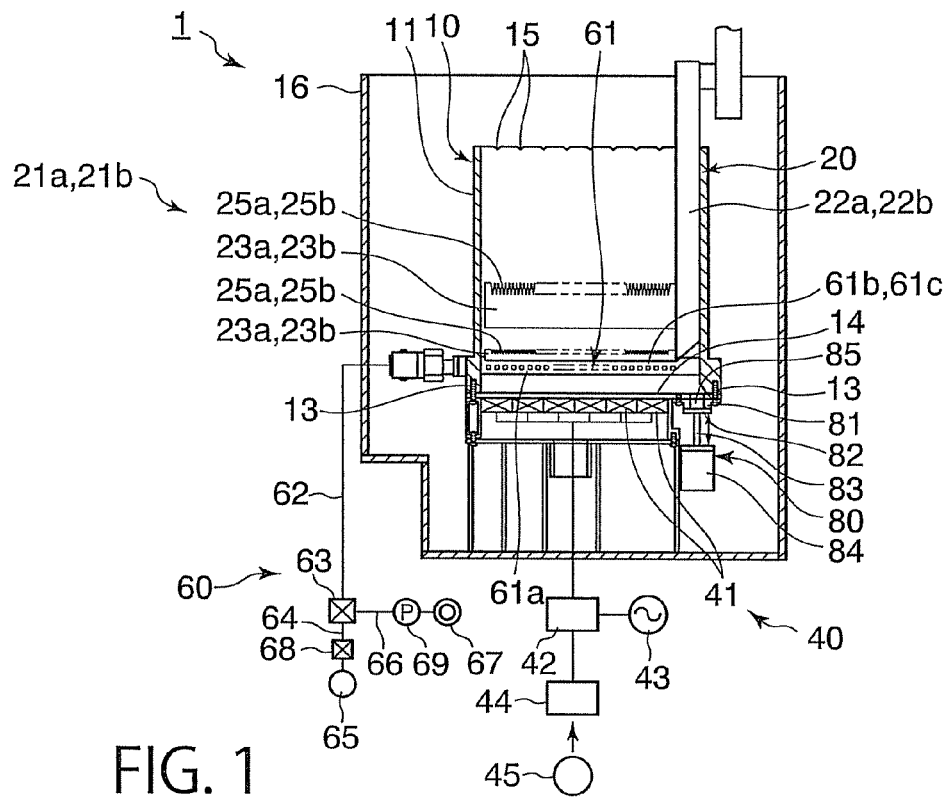
FIG. 1 is a view showing an ultrasonic cleaning apparatus in a first embodiment of the present invention.

As shown in FIG. 1, the ultrasonic apparatus 1 includes: a cleaning tank 10 configured to store a cleaning liquid (e.g., a deionized water or a chemical liquid); and a wafer board (an object-to-be-processed holder) 20 which can be inserted into the cleaning tank 10, the wafer board 20 being configured to hold an object to be processed (e.g., a semiconductor wafer, hereinafter referred to simply as "wafer W") and to immerse the wafer W into the cleaning liquid. A vibrator 40 is disposed on an outer surface of a bottom plate (bottom part) 14 of the cleaning tank 10. An ultrasonic oscillator 42 is connected to the vibrator 40, so that the vibrator 40 is made to ultrasonically vibrate.

The cleaning tank 10 is equipped with a cleaning-liquid supply apparatus 60 configured to supply a cleaning liquid into the cleaning tank 10. An exhaust valve mechanism 80 configured to discharge the cleaning liquid is disposed on the bottom plate 14 of the cleaning tank 10.

Next, detailed structures of the respective parts are described with reference to FIGS. 1 to 3.

Figure 2:
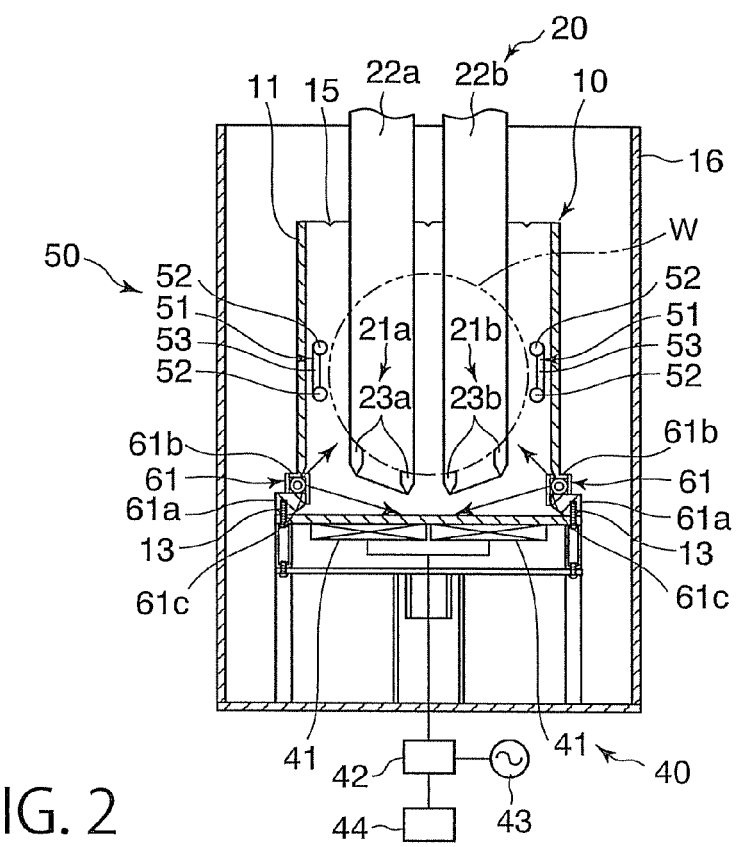
FIG. 2 is a side sectional view of FIG. 1.
Figure 3:
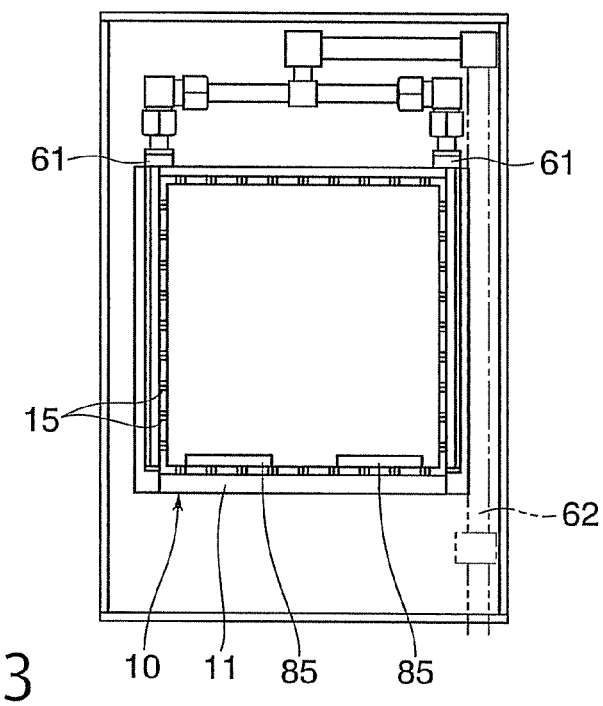
FIG. 3 is a plan view of FIG. 1.

As shown in FIGS. 1 to 3, the cleaning tank 10 is of a substantially rectangular parallelepiped shape, including four side walls 11 and the bottom plate 14 that is air-tightly and water-tightly in contact with lower ends of the respective side walls 11 through a packing 12, and is fixed thereto by fixation bolts 13. Cut grooves 15 are formed in upper ends of the side walls 11, so that the cleaning liquid outflows from cleaning tank 10, when a liquid surface of the cleaning liquid reaches the upper ends of the side walls 11.

The side wall 11 of the cleaning tank 10 is made of a material excellent in chemical resistance, such as polytetrafluoroethylene (PTFE) or fluorine resin (PFA). The bottom plate 14 is made of a material excellent in chemical resistance and acoustic transmission, e.g., a carbon-based material such as amorphous carbon or silicon carbide. Thus, even when an ammonia hydrogen peroxide mixture, a hydrochloric acid-peroxide mixture, or dilute hydrofluoric acid, which are described below, is used as the cleaning liquid, the side walls 11 and the bottom plate 14 can be resistant to these chemical liquids. Therefore, the side walls 11 and the bottom plate 14 can be prevented from being dissolved by the cleaning liquid to generate metal contaminants or the like. In addition, as described above, since the material of the bottom plate 14 also has an acoustic transmission, the ultrasonic vibration generated by the vibrator 40 can be reliably transmitted.

The cleaning tank 10 is accommodated in a container 16. On a bottom part of the container 16, there is disposed a pan (not shown) for collecting the cleaning liquid outflowing from the cut grooves 15 formed in the upper ends of the side walls 11 of each cleaning tank 10. The pan has a drain (not shown) for discharging the collected cleaning liquid.

Figure 5:
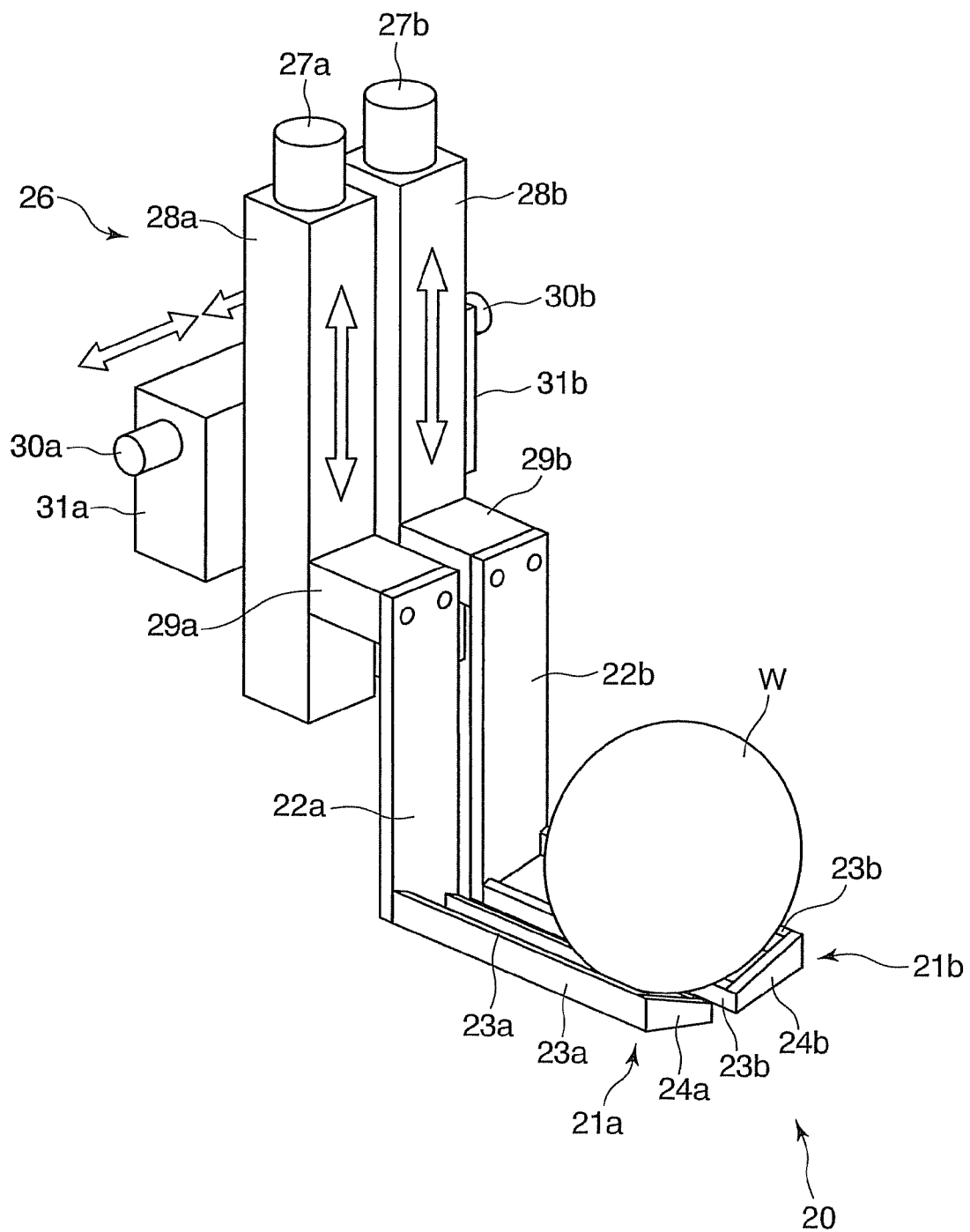
FIG. 5 is a view showing a structure of an object-to-be-processed holder, in the first embodiment of the present invention.
Figure 6:
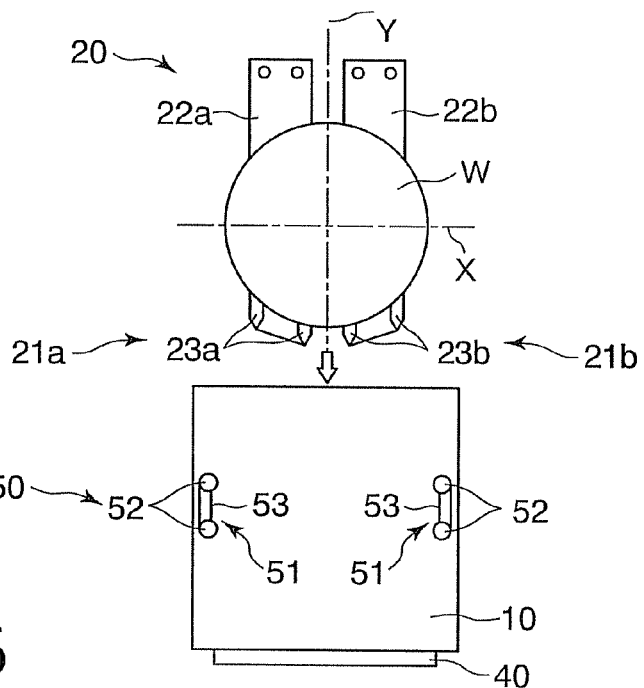
FIG. 6 is a view showing that a wafer is inserted into a cleaning tank, in an ultrasonic cleaning method in the first embodiment of the present invention.
Figure 7:
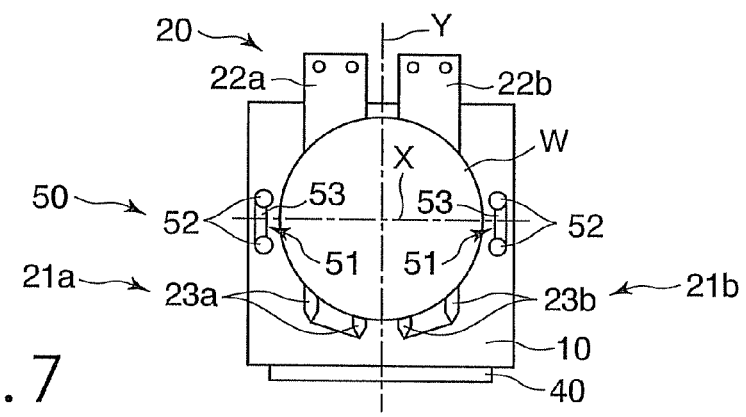
FIG. 7 is a view showing that the wafer is immersed in a cleaning liquid in the cleaning tank, in the ultrasonic cleaning method in the first embodiment of the present invention.

As shown in FIGS. 1, 2 and 5, the wafer board 20 includes a pair of wafer holding parts (object-to-be-processed holding parts) 21a and 21b configured to hold a plurality of (e.g., fifty) wafers W, and a pair of base parts 22a and 22b that are respectively joined to the wafer holding parts 21a and 21b and are extended in a substantially vertical direction. The pair of wafer holding parts 21a and 21b are arranged substantially symmetrically with respect to a vertical axis line Y (see, FIGS. 6 to 14) passing the center of the wafer W.

The respective wafer holding parts 21a and 21b are composed of two holding rods 23a and 23b that are extended in a substantially horizontal direction, and joint members 24a and 24b joined to distal ends of the respective holding rods 23a and 23b. The base parts 22a and 22b are respectively joined to proximal ends of the holding rods 23a and 23b. The respective holding rods 23a and 23b are provided with a plurality of holding grooves 25a and 25b engageable with wafers W (see, FIGS. 1 and 4). The respective holding grooves 25a and 25b have substantially the same shape, and are aligned with each other. By engaging wafers W with the holding grooves 25a and 25b, the wafers W can be held in a direction substantially perpendicular to the holding rods 23a and 23b, i.e., in the vertical direction.

The respective parts of the wafer board 20 are made of quartz that is excellent in chemical resistance, and are coated with Teflon (registered trademark) or SIC (silicon carbide).

A driving apparatus 26 for elevating and lowering the wafer board 20 is joined to the wafer board 20. Namely, the driving apparatus 26 includes: elevating and driving parts 27a and 27b respectively configured to elevate and lower the wafer holding parts 21a and 21b; and elevating-and-driving force transmitting parts 28a and 28b respectively joined between the elevating and driving parts 27a and 27b and the base parts 22a and 22b, the elevating-and-driving force transmitting parts 28a and 28b being configured to transmit driving forces of the elevating and driving parts 27a and 27b. The elevating-and-driving force transmitting parts 28a and 28b are respectively joined to the base parts 22a and 22b via adapters 29a and 29b. Thus, the respective wafer holding parts 21a and 21b can be moved (elevated and lowered) separately from each other. By using the respective elevating and driving parts 27a and 27b, a positional relationship between the wafer holding parts 21a and 21b can be adjusted.

A control device 44 is connected to the respective elevating and driving parts 27a and 27b. The control device 44 is configured to synchronically drive the respective elevating and driving parts 27a and 27b. Thus, based on a control signal from the control device 44, the elevating and driving parts 27a and 27b are configured to lower the wafer holding parts 21a and 21b so as to insert wafers W into the cleaning tank 10 and to immerse the wafers W into a cleaning liquid, and are configured to elevate the wafer holding parts 21a and 21b so as to unload the wafers W from the cleaning tank 10.

In addition, the wafer board 20 is configured to be capable of being substantially vertically moved (elevated and lowered) by the driving apparatus 26 in the cleaning tank 10, between a holding position at which a wafer W is held by the wafer board 20 (a position at which the wafer W is transferred to a bus hand 50 which is described below) and a lowered position located slightly below the holding position. That is to say, based on a control signal from the control device 44, the respective wafer holding parts 21a and 21b are configured to be moved between the holding position and the lowered position by the elevating and driving parts 27a and 27b.

Further, the wafer board 20 is configured to be capable of being substantially horizontally moved between the lowered position and a lateral position located laterally to the lowered position (the holding position), and the respective wafer holding parts 21a and 21b are configured to be capable of being substantially horizontally moved separately from each other. In this specification, the term "lateral" does not strictly mean the horizontal direction. For example, the term "lateral" is used to include diagonal directions with respect to the horizontal direction, as long as the wafer holding parts 21a and 21b can be displaced from areas of a wafer W, which are held by the wafer holding parts 21a and 21b so that propagation of ultrasonic vibration from the vibrator to the areas is blocked, such that the ultrasonic vibration can be propagated to the areas.

The driving apparatus 26 joined to the wafer board 20 is also configured to move the wafer board 20 between the lowered position and the lateral position. That is to say, the driving apparatus 26 includes: lateral-movement driving parts 30a and 30b respectively configured to move the wafer holding parts 21a and 21b between the lowered positions and the lateral positions; and lateral driving-force transmitting parts 31a and 31b respectively joined between the lateral-movement driving parts 30a and 30b and the elevating-and-driving force transmitting parts 28a and 28b, the lateral driving-force transmitting parts 31a and 31b being configured to transmit driving forces of the lateral-movement driving parts 30a and 30b.

The control device 44 is connected to the respective lateral-movement driving parts 30a and 30b. Thus, based on a control signal from the control device 44, the lateral-movement driving parts 30a and 30b are respectively configured to move the wafer holding parts 21a and 21b between the lowered positions and the lateral positions. In this case, the control device 44 is configured to move the wafer holding parts 21a and 21b substantially symmetrically with respect to the vertical axis line Y passing the center of the wafer W.

As shown in FIGS. 2 and 6 to 14, disposed in the cleaning tank 10 is a bus hand (a lateral holding member) 50 configured to receive a wafer W from the wafer board 20 and to hold the same. The bus hand 50 is configured to be substantially horizontally movable in the cleaning tank 10, between a transfer position at which a wafer W is received and held by the bus hands 50, and a withdrawn position which is withdrawn from the wafer W to be away therefrom. Namely, the bus hand 50 includes a pair of pinching parts 51 disposed on both lateral sides of a wafer W held by the wafer board 20. The pinching parts 51 are configured to come into contact with the side surface of the wafer W so as to pinch the wafer W therebetween. Each of the pinching parts 51 includes two contact rods 52 configured to be in contact with the side surface of the wafer W, and a joining member 53 that joins the respective contact rods 52. The two contact rods 52 of each pinching part 51 are symmetrically arranged with respect to a horizontal axis line X (see, FIGS. 6 to 14) passing the center of the wafer W, at positions near to an intersection point between the horizontal axis line X of the wafer W and the outer circumference of the wafer W. Thus, formation of areas in each wafer W, in which ultrasonic vibration propagated from below is blocked by the pinching parts 51, can be prevented, whereby all the areas of the wafer W can be ultrasonically cleaned uniformly.

Similarly to the wafer board 20, the respective parts of the bus hand 50 are made of quartz that is excellent in chemical resistance, and are coated with Teflon or SiC (silicon carbide).

Joined to the respective pinching parts 51 is a hand driving part (not shown) configured to cooperatively move the respective pinching parts 51 between the transfer positions and the withdrawn positions. The control device 44 is joined to the hand driving part. Thus, based on a control signal from the control device 44, the hand driving part is configured to cooperatively move the respective pinching parts 51 between the transfer positions and the withdrawn positions.

The cleaning-liquid supply apparatus 60 includes two cleaning-liquid supply nozzles 61 disposed along the opposed side walls 11 of the cleaning tank 10. Each of the cleaning-liquid supply nozzle 61 includes a tubular nozzle body 61a extended substantially horizontally along the side wall 11 of the cleaning tank 10, and a number of first nozzle holes 61b and a number of second nozzle holes 61c formed in the tubular nozzle body 61a at suitable intervals therebetween along the longitudinal direction. The first nozzle holds 61b are configured to jet a cleaning liquid toward the center of the wafer W, and the second nozzle holes 61c are configured to jet a cleaning liquid toward the bottom plate 14 of the cleaning tank 10.

A selector valve 63 is joined to the cleaning-liquid supply nozzle 61 through a cleaning-liquid supply pipe 62. Joined to the selector valve 63 are a deionized-water supply source 65 through a deionized-water supply pipe 64, and a chemical-liquid supply source (chemical liquid reservoir) 67 through a chemical-liquid supply pipe 66. The selector valve 63 is connected to the control device 44. The control device 44 is configured to control selection of the supply pipe (the deionized-water supply pipe 64 or the chemical-liquid supply pipe 66) to be communicated with the cleaning-liquid supply pipe 62.

The deionized-water supply pipe 64 is provided with an opening and closing valve 68 configured to regulate a flow rate of a deionized water flowing through the deionized-water supply pipe 64. The opening and closing valve 68 is connected to the control device 44. The control device 44 is configured to control supply of a deionized water from the deionized-water supply source 65 to the cleaning tank 10 via the opening and closing valve 68.

The chemical-liquid supply pipe 66 is provided with a chemical liquid pump 69 for supplying a chemical liquid to the cleaning tank 10. The chemical-liquid pump 69 is connected to the control device 44. The control device 44 is configured to control supply of a chemical liquid from the chemical liquid reservoir 67 to the cleaning tank 10 via the chemical-liquid pump 69. As the chemical liquid, an ammonia hydrogen peroxide mixture (SC1, specifically, $NH_4OH/H_2O_2/H_2O$), a hydrochloric acid-peroxide mixture (SC2, specifically, $HCl/H_2O_2/H_2O$), or dilute hydrofluoric acid (DHF) is used according to the purpose of the cleaning.

Alternatively, without using the chemical liquid pump 69, nitrogen ($N_2$) gas or the like may be supplied into the chemical liquid reservoir 67, based on a control signal from the control device 44, so as to supply the chemical liquid to the chemical-liquid supply pipe 66. In addition, the number of the chemical liquid reservoir 67 to be connected to the selector valve 63 is not limited to one, and the plurality of chemical liquid reservoirs 67 may be connected to the selector valve 63. In this case, plural kinds of chemical liquids can be supplied to the cleaning tank 10.

Figure 4:
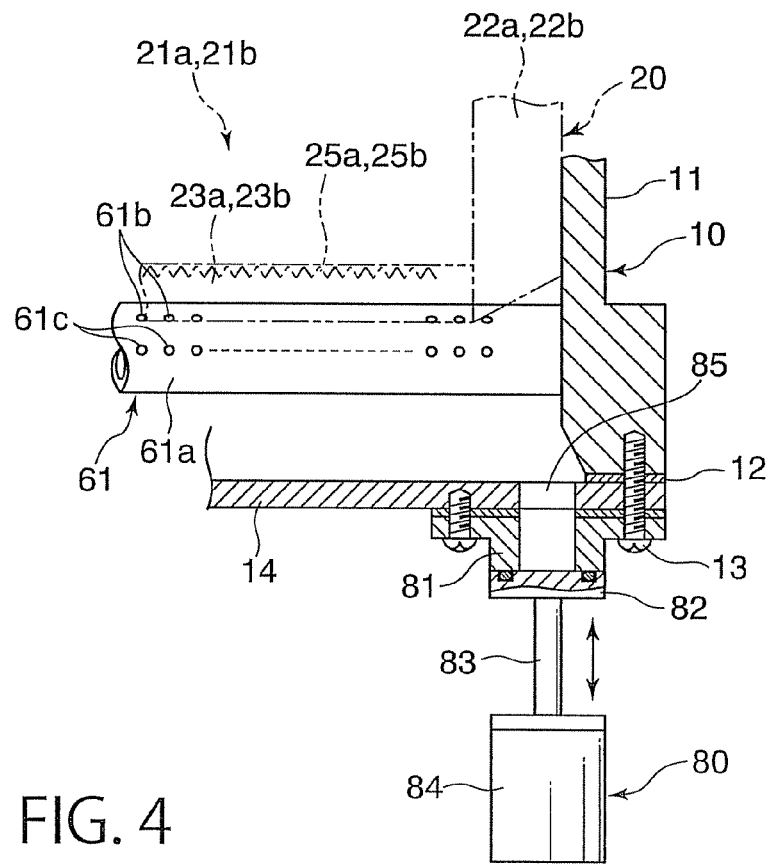
FIG. 4 is a view showing an exhaust valve mechanism, in the first embodiment of the present invention.

As shown in FIGS. 3 and 4, the bottom plate 14 of the cleaning tank 10 is provided with two exhaust valve mechanisms 80 for discharging the cleaning liquid. Each exhaust valve mechanism 80 includes: a part to be contacted 81 disposed on the outer surface of the bottom plate 14; a valve member 82 capable of being air-tightly and water-tightly brought into contact with the part to be contacted 81; and a cylinder apparatus 84 having a piston rod 83 for driving the valve member 82. A drain port 85 is formed to pass through the part to be contacted 81 and the bottom plate 14. The control device 44 is connected to the cylinder apparatus 84, and the cylinder apparatus 84 is configured to drive the valve member 82 based on a control signal from the control device 44. The drain port 85 is located on a position directly below the base part 22 of the wafer board 20. Thus, the vibrator 30 can be attached to the outer surface of the bottom plate 14 of the cleaning tank 10 at a position corresponding to the wafers W, without being interfered with by the exhaust valve mechanisms 80. Accordingly, the wafers W can be reliably cleaned. In this embodiment, although the drain port 85 has a rectangular shape, the drain port 85 may have any optional shape such as a circular shape and so on. Further, the number of the exhaust valve mechanisms 80 disposed on each cleaning tank 10 is not limited to two, and the number thereof may be one or three or more.

As shown in FIGS. 1 and 2, the vibrator 40 of the cleaning tank 10 is composed of a plurality of vibrator units 41, and the vibrator units 41 are attached to the outer surface of the bottom plate 14 of the cleaning tank 10. Each of the vibrator units 41 is connected to constitute the vibrator 40, and is connected to the ultrasonic oscillator 42. The number of the vibrator units 41 to be disposed on the cleaning tank 10 may be one or other, as long as the vibrator units 41 can occupy positions corresponding to the wafers W held by the wafer board 20.

The ultrasonic oscillator 42 is connected to the vibrator 40, and a drive power source 43 for supplying power is connected to the ultrasonic oscillator 42. The control device 44 is connected to the ultrasonic oscillator 42. Based on an instruction from the control device 44, the ultrasonic oscillator 42 is configured to send a radiofrequency drive power (a drive signal) to the vibrator 40.

After the wafer W has been transferred from the wafer board 20 to the bus hand 50, the control device 44 moves the wafer holding parts 21a and 21b of the wafer board 20 from the holding positions to the lowered positions, and continuously moves the wafer holding parts 21a and 21b substantially symmetrically between the lowered positions and the lateral positions. Then, during the movement between the lowered positions and the lateral positions, the control device 44 is configured to make the vibrator 40 ultrasonically vibrate. Thus, the ultrasonic vibration from the vibrator 40 is propagated to areas of each wafer W, which have been held by the wafer holding parts 21a and 21b, whereby the ultrasonic vibration is uniformly propagated to all the areas of the wafer W. After the ultrasonic cleaning of the wafer W has been finished, the control device 44 is configured to move the wafer holding parts 21a and 21b to the holding positions via the lowered positions, and to transfer the wafer W from the bus hands 50 to the wafer board 20.

In this embodiment, the control device 44 includes a computer, and the computer executes a program previously stored in a storage medium 45, whereby the cleaning of the wafers W using the ultrasonic cleaning apparatus 1 can be performed.

Next, an operation of this embodiment as structured above, i.e., an ultrasonic cleaning method in this embodiment is described with reference to FIGS. 6 to 14.

A cleaning liquid is supplied to the cleaning tank 10 (a 1st step). In this case, as shown in FIG. 1, the opening and closing valve 68 is opened based on a control signal from the control device 44, so that a deionized water is supplied form the deionized-water supply source 65 to the cleaning-liquid supply nozzle 61 via the selector valve 63. At this time, under the control of the control device 44, the selector valve 63 communicates the deionized-water supply pipe 64 to the cleaning-liquid supply pipe 62.

After the supply of the deionized water, the chemical liquid pump 69 is driven based on a control signal from the control device 44, so that a chemical liquid is supplied from the chemical liquid reservoir 67 to the cleaning-liquid supply nozzle 61 via the selector valve 63. At this time, under the control of the control device 44, the selector valve 63 communicates the chemical-liquid supply pipe 66 to the cleaning-liquid supply pipe 62.

When a liquid surface level of the stored cleaning liquid reaches the cut grooves 15 formed in the upper ends of the side walls 11 of the cleaning tank 10, the cleaning liquid outflows form the cleaning tank 10 through the cut grooves 15. The outflowing cleaning liquid is collected by the pan (not shown) of the container 16 accommodating the cleaning tank 10, and is discharged outside the container 16 from the not-shown drain. Thereafter, the chemical liquid is continuously supplied from the chemical liquid reservoir 67.

Then, wafers W are immersed into the cleaning liquid in the cleaning tank 10 (a 2nd step). In this case, a plurality of, e.g., fifty wafers W, which have been transported by the not-shown transport mechanism, are engaged with the holding grooves 25a and 25b formed in the holding rods 23a and 23b of the wafer board 20, so that the wafers W are held by the wafer holding parts 21a and 21b (see, FIG. 6). Then, based on a control signal from the control device 44, the elevating and driving parts 27a and 27b are synchronically driven, such that the wafer holding parts 21a and 21b holding the wafers W are lowered so as to insert the wafer W into the cleaning tank 10 (see, FIG. 7). Thus, the wafers W are immersed into the cleaning liquid. At this time, the wafer holding parts 21a and 21b are located at the holding positions for holding the wafers W.

Then, the wafers W are transferred from the wafer board 20 to the bus hand 50 (a 3rd step). In this case, based on a control signal from the control device 44, the hand driving part is driven, such that the respective pinching parts 51 are moved from the withdrawn positions to the transfer positions so as to come into contact with the side surface of each wafer W (see FIG. 8). Thus, the wafer W is pinched by the pair of pinching parts 51 so as to be held by the bus hand 50. At this time, the wafer holding parts 21a and 21b are maintained at the holding positions for holding the wafer W.

Then, the wafer board 20 is lowered from the position at which the wafer W is held by the wafer board 20 (a 4th step). Namely, based on a control signal from the control device 44, the elevating and driving parts 27a and 27b are synchronically driven, such that the wafer holding parts 21a and 21b are lowered (see, FIG. 9). Thus, the wafer holding parts 21a and 21b come away from the wafer W. At this time, the wafer holding parts 21a and 21b are located at the lowered positions located below the holding positions.

Then, the wafer board 20 is continuously moved between the lowered position and the lateral position (a 5th step). In this case, based on a control signal from the control device 44, the lateral-movement driving parts 30a and 30b are driven, such that the wafer holding parts 21a and 21b are substantially symmetrically moved with respect to the vertical axis line Y passing the center of the wafer W. Namely, the one wafer holding part 21a is moved leftward in FIG. 9, and the other wafer holding part 21b is moved rightward, so that the wafer holding parts 21a and 21b reach the lateral positions (see, FIG. 10). Thereafter, the one wafer holding part 21a having moved leftward is moved rightward, and the other wafer holding part 21b having moved rightward is moved leftward, so that the wafer holding parts 21a and 21b are returned to the lowered positions (see, FIG. 11). In this manner, the wafer holding parts 21a and 21b are continuously reciprocated substantially symmetrically between the lowered positions and the lateral positions. Namely, at a time point when the below-described ultrasonic cleaning step (a 6th step) is finished, the wafer holding parts 21a and 21b are returned to the lowered positions. The reciprocating number of the wafer holding parts 21a and 21b between the lowered positions and the lateral positions is not limited to one, but may be more than one.

While the wafer board 20 is being moved between the lowered position and the lateral position, the control device 44 makes the vibrator 40 ultrasonically vibrate (the 6th step). In this case, by sending a radiofrequency drive power (a drive signal) from the ultrasonic oscillator 42 to the vibrator 40 of the cleaning tank 10 so as to make the vibrator 40 ultrasonically vibrate, the wafers W are ultrasonically cleaned. In this manner, since the ultrasonic vibration is generated while the wafer board 20 is being moved, the ultrasonic cleaning can be efficiently carried out for a short period of time. In addition, during this ultrasonic cleaning, the wafer holding parts 21a and 21b are continuously moved between the lowered positions located below the holding positions and the lateral positions. Thus, there is no possibility that the wafer holding parts 21a and 21b come into contact with the wafers W, during the movement of the wafer holding parts 21a and 21b between the lowered positions and the lateral positions.

While the vibrator 40 is being ultrasonically vibrated, the ultrasonic vibration transmits the bottom plate 14 of the cleaning tank 10 to be propagated to the cleaning liquid. Thus, particles or the like adhering to the wafers W can be removed. At this time, the chemical liquid is continuously supplied into the cleaning tank 10, whereby the particles having been removed from the wafers W and floating on the liquid surface of the cleaning liquid can be made to outflow, together with the overflowing cleaning liquid, from the cutting grooves 15 of the cleaning tank 10. Therefore, the cleaning liquid can be maintained clean, and the cleaning efficiency of the wafer W can be improved.

After the ultrasonic cleaning the wafers W has been carried out, a rinse process of the wafer W in the cleaning tank 10 is carried out (a 7th step). In this case, the chemical liquid pump 69 is firstly stopped, so that the supply of the chemical liquid to the cleaning tank 10 is stopped. Then, the control device 44 opens the opening and closing valve 68 and actuates the selector valve 63 such that a deionized water is supplied form the deionized-water supply source 65 to the cleaning tank 10. Thereafter, similarly to the aforementioned 6th step, the vibrator 40 is made to ultrasonically vibrate, so that the ultrasonic vibration is propagated to the cleaning liquid.

Then, the wafers W are transferred from the bus hand 50 to the wafer board 20 (an 8th step and a 9th step). In this case, based on a control signal from the control device 44, the elevating and driving parts 27a and 27b are synchronically driven, such that the wafer holding parts 21a and 21b are elevated so that the wafers W are engaged with the holding grooves 25a and 25b of the holding rods 23a and 23b so as to be held by the wafer holding parts 21a and 21b (the 8th step, see FIG. 12). In this manner, the wafers W are transferred from the bus hand 50 to the wafer board 20. At this time, the wafer holding parts 21a and 21b are located at the holding positions for holding the wafers W.

Figure 13:
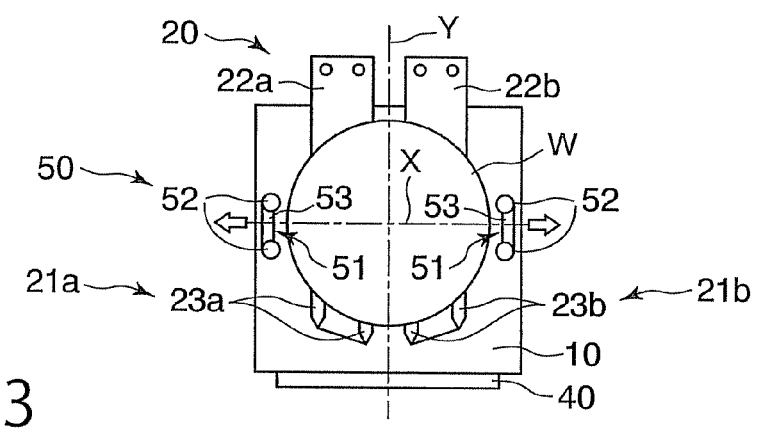
FIG. 13 is a view showing that the bus hand is moved to a withdrawn position, in the ultrasonic cleaning method in the first embodiment of the present invention.
Figure 14:
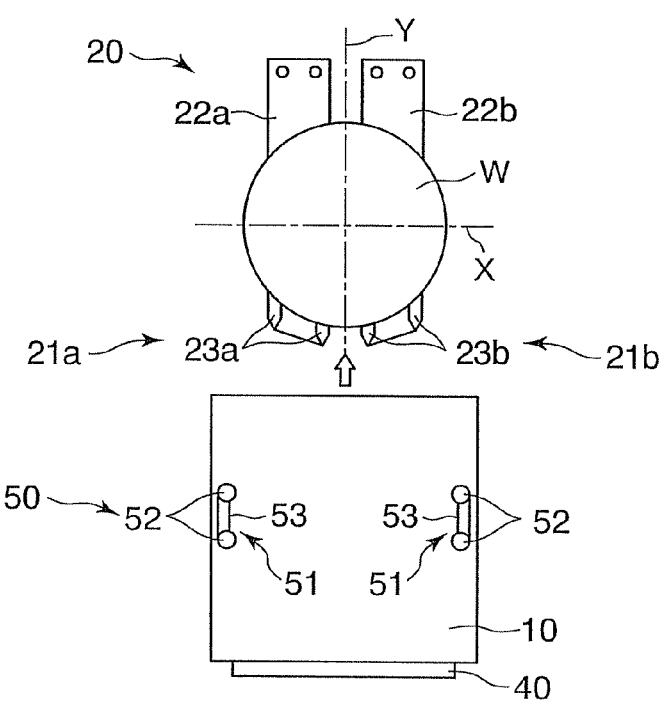
FIG. 14 is a view showing that the wafer is taken out from the cleaning tank, in the ultrasonic cleaning method in the first embodiment of the present invention.

Thereafter, based on a control signal from the control device 44, the hand driving part is driven such that the respective pinching parts 51 are moved from the transfer positions to the withdrawn positions (the 9th step, see FIG. 13). Thus, the bus hand 50 comes away from the wafers W. At this time, the wafer holding parts 21a and 21b are maintained at the holding positions.

Then, the wafers W immersed in the cleaning liquid are unloaded from the cleaning tank 10 (a 10th step). In this case, based on a control signal from the control device 44, the elevating and driving parts 27a and 27b are synchronically driven, such that the wafer holding parts 21a and 21b holding the wafers W are elevated so that the wafers W are unloaded from the cleaning tank 10. After that, the wafers W are transported from the wafer board 20 to the not-shown transport mechanism.

Following thereto, by suitably repeating the above steps, the wafers W can be sequentially, ultrasonically cleaned in the cleaning tank 10.

The cleaning liquid in the cleaning tank 10 is replaced according to need. For example, as shown in FIG. 3, when the cleaning liquid in the cleaning tank 10 is replaced, based on a control signal from the control device 44, the cylinder apparatus 84 of the exhaust valve mechanism 80 is driven, so that the valve member 82 is drawn away from the part to be contacted 81. Thus, the cleaning liquid is discharged through the drain port 85, whereby the cleaning liquid in the cleaning tank 10 can be discharged for a short period of time. After the cleaning liquid has been discharged, the cylinder apparatus 84 is driven so that the valve member 82 is brought into contact with the part to be contacted 81. Thus, the part to be contacted 81 and the valve member 82 maintain air-tightness and water-tightness therebetween. Thereafter, the cleaning liquid is supplied to the cleaning tank 10, in the same manner as that of the above 1st step. In this manner, the cleaning liquid is replaced.

According to this embodiment, the wafers W, which are immersed in the cleaning liquid in the cleaning tank 10 and are held by the wafer holding parts 21a and 21b of the wafer board 20, are transferred to the bus hand 50 disposed on the cleaning tank 10. After that, the wafer holding parts 21a and 21b are moved from the holding positions to the lowered positions, and then continuously moved between the lowered positions and the lateral positions. While the wafer holding parts 21a and 21b are being moved between the lowered positions and the lateral positions, the control device 44 make the vibrator 40 ultrasonically vibrate. Thus, the ultrasonic vibration from the vibrator 40 can be propagated to the areas of each wafer W, which are to be held by the wafer holding parts 21a and 21b (the areas of each wafer W, which are to be blocked by the wafer holding parts 21a and 21b), and the ultrasonic vibration can be uniformly propagated to all the areas of the wafer W. Therefore, all the areas of the wafer W can be ultrasonically cleaned uniformly.

According to the present invention, the wafer holding parts 21a and 21b are located substantially symmetrically with respect to the vertical axis line Y passing the center of the wafer W, and are moved substantially symmetrically with respect to the vertical axis line Y between the lowered positions and the lateral positions. Thus, after the wafers W have been transferred from the wafer board 20 to the bus hand 50, a lowering distance (a distance between the holding position and the lowered position) of the wafer holding part 21*a* (21*b*) can be reduced. In addition, a moving distance of the wafer holding part 21*a* (21*b*) between the lowered position and the lateral position can be reduced. Therefore, the structure of the driving apparatus 26 can be simplified.

In the aforementioned embodiment, various modifications are possible within the scope of the present invention. Typical modifications are described herebelow.

That is to say, in the above embodiment, the wafer holding parts 21*a* and 21*b* of the wafer board 20 are continuously moved between the lowered positions and the lateral positions. However, not limited thereto, the control unit 44 may operate the wafer holding parts 21*a* and 21*b* such that the wafer holding parts 21*a* and 21*b* stop for a predetermined period, after having been moved from the lowered positions to reach the lateral positions, and that the wafer holding parts 21*a* and 21*b* are then moved from the lateral positions to the lowered positions. Also in this case, the ultrasonic vibration can be propagated to the areas of each wafer W, which are to be held by the wafer holding parts 21*a* and 21*b*, and the ultrasonic vibration can be uniformly propagated to all the areas of the wafer W.

As described above, when the wafer holding parts 21*a* and 21*b* having reached the lateral positions are stopped thereat for a predetermined period, the control device 44 may operate the vibrator 40 such that the vibrator 40 is made to ultrasonically vibrate only when the wafer holding parts 21*a* and 21*b* are stopped at the lateral positions. That is to say, after the wafers W have been transferred from the wafer board 20 to the bus hand 50, the wafer holding parts 21*a* and 21*b* are moved from the lowered positions to the lateral position. When the wafer holding parts 21*a* and 21*b* are located at least at the lateral positions, the control device 44 may make the vibrator 40 ultrasonically vibrate. In this case, the ultrasonic vibration from the vibrator 40 can be reliably propagated to the areas of each wafer W, which are to be held by the holding parts 21*a* and 21*b*, and the ultrasonic vibration can be uniformly propagated to all the areas of the wafer W.

In addition, in the above embodiment, while the wafer holding parts 21*a* and 21*b* are being continuously moved between the lowered positions and the lateral positions, the control device 44 makes the vibrator 40 ultrasonically vibrate. However, not limited thereto, the vibrator 40 may be made to ultrasonically vibrate only when the wafer holding pats 21*a* and 21*b* are moved from the lowered positions to the lateral positions. Alternatively, the vibrator 40 may be made to ultrasonically vibrate only when the wafer holding parts 21*a* and 21*b* are moved from the lateral positions to the lowered positions. In both cases, the ultrasonic vibration from the vibrator 40 can be propagated to the areas of each wafer W, which are to be held by the wafer holding parts 21*a* and 21*b*, and the ultrasonic vibration can be uniformly propagated to all the areas of the wafer W.

In addition, in the above embodiment, the wafer board 20 has the pair of wafer holding parts 21*a* and 21*b*, and the wafer holding pats 21*a* and 21*b* are moved separately from each other. However, not limited thereto, the wafer holding parts 21*a* and 21*b* may be integrally formed with each other, so as to be integrally moved between the lowered positions and the lateral positions. Also in this case, the ultrasonic vibration from the vibrator 40 can be propagated to the areas of each wafer W, which are to be held by the wafer holding parts 21*a* and 21*b*, and the ultrasonic vibration can be uniformly propagated to all the areas of the wafer W.

In addition, in the above embodiment, the wafer holding parts 21*a* and 21*b* are moved from the holding positions to the lateral positions via the lowered positions located below the holding positions, and are moved from the lateral positions to the holding positions via the lowered positions. However, not limited thereto, the wafer holding parts 21*a* and 21*b* may be moved between the holding positions and the lateral positions without passing through the lowered positions. In this case, the drive control of the wafer holding parts 21*a* and 21*b* can be simplified.

In addition, in the above embodiment, the wafer holding parts 21*a* and 21*b* are moved substantially symmetrically with respect to the vertical axis line Y passing the center of the wafer W. However, not limited thereto, the wafer holding parts 21*a* and 21*b* may be moved in the same direction between the lowered positions and the lateral positions. In this case, for example, the one wafer holding part (the first wafer holding part) 21*a* is firstly moved leftward from the lowered position to the lateral position (see, FIG. 10). Then, while the first wafer holding part 21*a* is moved rightward from the lateral position to the lowered position, the other wafer holding part (the second wafer holding part) 21*b* is moved rightward from the lowered position to the lateral position. Thereafter, the second wafer holding parts 21*b* is moved leftward form the lateral position to the lowered position. In this manner, while the wafer holding parts 21*a* and 21*b* are being moved, the vibrator 40 may be made to ultrasonically vibrate. Also in this case, the ultrasonic vibration from the vibrator 40 can be propagated to the areas of each wafer W, which are to be held by the wafer holding parts 21*a* and 21*b*, and the ultrasonic vibration can be uniformly propagated to all the areas of the wafer W. In this case, the reciprocating number of the wafer holding parts 21*a* and 21*b* between the lowered positions and the lateral positions may be optionally determined.

As described above, when the wafer holding parts 21*a* and 21*b* are moved in the same direction between the lowered positions and the lateral positions, after the wafer W has been transferred from the wafer board 20 to the bus hand 50, the control device 44 may make the vibrator 40 ultrasonically vibrate, when one of the wafer holding parts, e.g., the first wafer holding part 21*a* is moved from the lowered position to the lateral position so that the first wafer holding part 21*a* is located at least at the lateral position. Alternatively, the vibrator 40 may be made to ultrasonically vibrate, only while the first wafer holding part 21*a* is moved from the lowered position to the lateral positions, and only while the other wafer holding part (the second wafer holding part) 21*b* is moved from the lateral position to the lowered position. Alternatively, the vibrator 40 may be made to ultrasonically vibrate, only when the first wafer holding part 21*a* is moved from the lateral position to the lowered position and the second wafer holding part 21*b* is moved from the lowered position to the lateral position. Also in these cases, the ultrasonic vibration from the vibrator 40 can be propagated to the areas of each wafer W, which are to be held by the wafer holding parts 21*a* and 21*b*, and the ultrasonic vibration can be uniformly propagated to all the areas of the wafer W.

In addition, in the above embodiment, the cleaning tank 10 is accommodated in the container 16, and the pan for collecting the cleaning liquid outflowing from the cleaning tank 10 is disposed on the bottom part of the container 16. However, not limited thereto, the cleaning tank 10 may include an inner tank in which the cleaning liquid is stored, and an outer tank by which the cleaning liquid overflowing from the inner tank is collected. In this case, a circulation path for supplying the cleaning liquid to a cleaning-liquid supply nozzle, which is provided in the inner tank, may be connected to the outer tank. Alternatively, the outer tank may be provided with an exhaust valve mechanism for discharging the cleaning liquid.

In addition, in this embodiment, the two cleaning-liquid supply nozzles 61 are disposed in each cleaning tank 10. However, not limited thereto, the four cleaning-liquid supply nozzles 61 (not shown) may be disposed.

In addition, in the above embodiment, the bottom plate 14 of the cleaning tank 10 is made of amorphous carbon or silicon carbide. The thickness of the bottom plate 14 is relatively larger (e.g., 6.5 mm), and the vibrator 40 is directly attached to the bottom plate 14. However, not limited thereto, the thickness of the bottom plate 14 may be smaller, and the vibrator 30 may be attached to the bottom plate 14, with a stainless reinforcing plate excellent in acoustic transmission being sandwiched between the bottom plate 14 and the vibrator 40. Also in this case, the ultrasonic waves from the vibrator 40 can be efficiently transmitted.

In addition, in the above embodiment, the vibrator 40 is directly attached to the bottom plate 14 of the cleaning tank 10. However, not limited thereto, an additional tank (not shown), which stores a deionized water such that at least the bottom part of the cleaning tank 10 is immersed therein, may be disposed below the cleaning tank 10, and the vibrator 40 may be disposed on a bottom part of the additional tank. In this case, the ultrasonic vibration generated by the vibrator 40 can be propagated to the cleaning tank 10 via the deionized water in the additional tank, and the wafers W can be reliably ultrasonically cleaned in the cleaning tank 10.

Although some modifications of the embodiment are individually described, the aforementioned modifications may be suitably combined.

Second Embodiment

Figure 15:
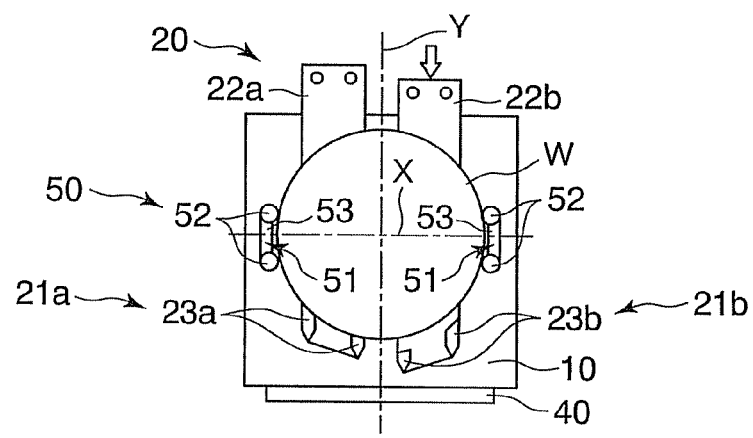
FIG. 15 is a view showing that a second wafer holding part is moved to a second lowered position, in the ultrasonic cleaning method in a second embodiment of the present invention.
Figure 16:
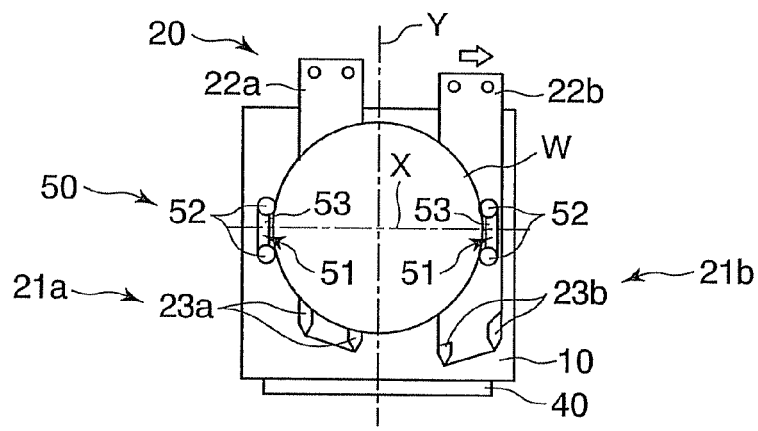
FIG. 16 is a view showing that the second wafer holding part is moved to a second lateral position, in the ultrasonic cleaning method in the second embodiment of the present invention.
Figure 17:
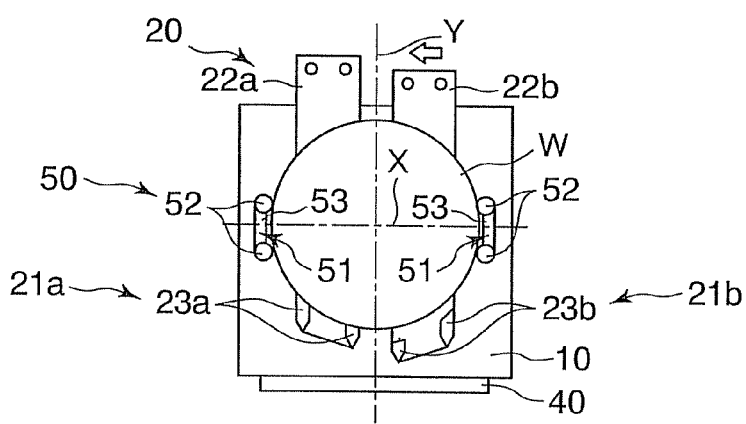
FIG. 17 is a view showing that the second wafer holding part is moved to the second lowered position, in the ultrasonic cleaning method in the second embodiment of the present invention.

A second embodiment of the present invention will be described with reference to FIGS. 15 to 17. FIGS. 15 to 17 are views explaining an ultrasonic cleaning apparatus in the second embodiment, an ultrasonic cleaning method in the second embodiment, and a storage medium storing a computer program for executing the ultrasonic cleaning method.

The second embodiment shown in FIGS. 15 to 17 mainly differs from the first embodiment shown in FIGS. 1 to 14 in that, the ultrasonic cleaning is carried out after a wafer has been held by the bus hand and the first wafer holding part of the wafer board, and the second wafer holding part has been laterally moved. The other structures of the second embodiment are substantially the same with those of the first embodiment. In FIGS. 15 to 17, the same parts as those of the first embodiment shown in FIGS. 1 to 14 are indicated by the same reference numbers, and detailed description thereof is omitted.

The wafer board 20 in this embodiment includes the pair of wafer holding parts 21a and 21b (i.e., the first wafer holding part 21a and the second wafer holding part 21b) which can be moved separately from each other.

The control device 44 controls the driving apparatus 26 such that, after the wafer W has been held by the bus hand 50 and the first wafer holding part 21a of the wafer board 20, the second wafer holding part 21b of the wafer board 20 is moved from a second holding position to a second lateral position via a second lowered position, and that the second wafer holding part 21b is then returned from the second lateral position to the second holding position via the second lowered position. After that, the control device 44 controls the driving apparatus 26 such that, after the wafer W has been held by the bus hand 50 and the second wafer holding part 21b, the first wafer holding part 21a is moved from a first holding position to a first lateral position via a first lowered position, and that the first wafer holding part 21a is then returned from the first lateral position to the first holding position via the first lowered position.

The control device 44 controls the ultrasonic oscillator 42 such that the vibrator 40 is made to ultrasonically vibrate, while the second wafer holding parts 21b is being moved between the second lowered position and the second lateral position, and while the first wafer holding part 21a is being moved between the first lowered position and the first lateral position. In this manner, the ultrasonic vibration from the vibrator 40 can be propagated to the areas of the wafer W, which have been held by the wafer holding parts 21a and 21b (the areas of the wafer W, which have been blocked by the wafer holding parts 21a and 21b). The control device 44 controls the driving apparatus 26 such that the movement of the first wafer holding part 21a and the movement of the second wafer holding part 21b are made equal to each other, whereby the period when the propagation of the ultrasonic vibration to the one area of the wafer W is blocked by the first wafer holding part 21a, and the period when the propagation of the ultrasonic vibration to the other area of the wafer W is blocked by the second wafer holding part 21b, are made equal to each other.

Next, the ultrasonic cleaning method in this embodiment is described. Herein, steps different from those of the first embodiment are mainly described.

Figure 8:
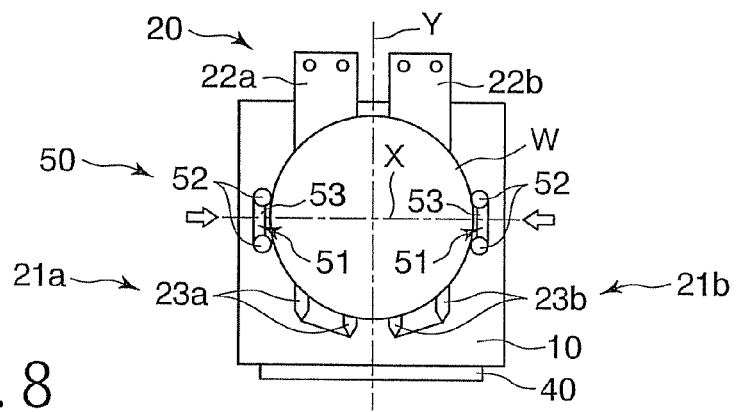
FIG. 8 is a view showing that the wafer is transferred from a wafer board to a bus hand, in the ultrasonic cleaning method in the first embodiment of the present invention.
Figure 9:
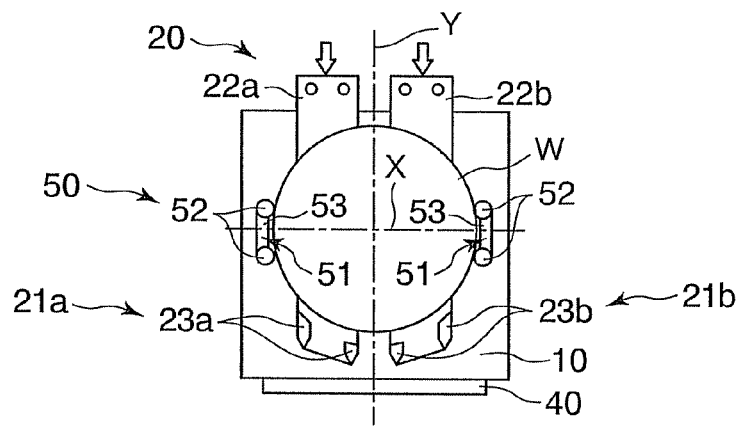
FIG. 9 is a view showing that the wafer board is moved to a lowered position, in the ultrasonic cleaning method in the first embodiment of the present invention.
Figure 10:
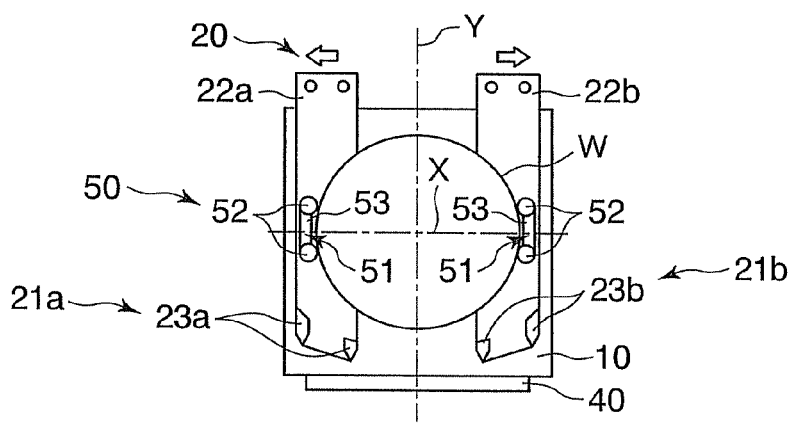
FIG. 10 is a view showing that the wafer board is moved to a lateral position, in the ultrasonic cleaning, method in the first embodiment of the present invention.
Figure 11:
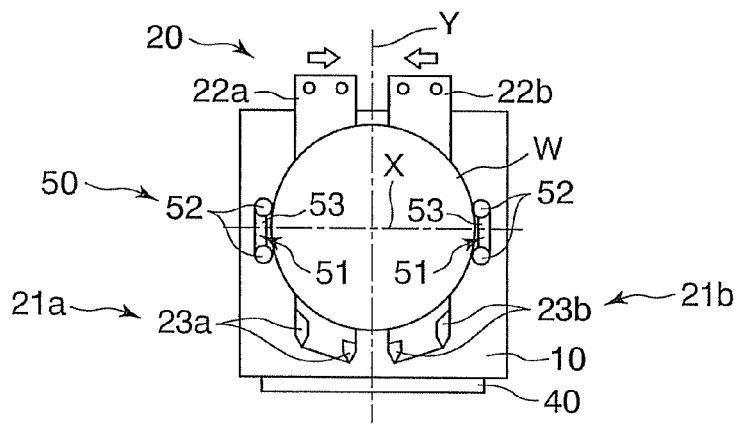
FIG. 11 is a view showing that the wafer board is moved to the lowered position, in the ultrasonic cleaning method in the first embodiment of the present invention.

At first, the wafer W immersed in the cleaning liquid is pinched by the pair of pinching parts 51 of the bus hand 50 (the 3rd step, see FIG. 8). In this case, based on a control signal from the control device 44, the hand driving part is driven such that the respective pinching parts 51 are moved from the withdrawn positions to the transfer positions so as to come into contact with the side surface of the wafer W. Thus, the wafer W is pinched by the pair of pinching parts 51. At this time, the first wafer holding part 21a and the second wafer holding parts 21b are respectively maintained at the first holding position and the second holding position for holding the wafer W.

Then, the second wafer holding part 21 of the wafer board 20 is laterally moved, and the ultrasonic cleaning of the wafer W is carried out.

In this case, the second wafer holding part 21b of the wafer board 20 is firstly lowered from the position at which the wafer W is held (a 21st step). Namely, based on a control signal from the control device 44, the elevating and driving part 27b is driven such that the second wafer holding part 21b is lowered (see, FIG. 15). Thus, the wafer W is held by the bus hand 50 and the first wafer holding part 21a, and the second wafer holding part 21b comes away from the wafer W. At this time, the second wafer holding part 21b is located at the second lowered position located below the second holding position.

Then, the second wafer holding part 21b is continuously moved between the second lowered position and the second lateral position (a 22nd step). In this case, based on a control signal from the control device 44, the lateral-movement driving part 30b is driven such that the second wafer holding part 21b is moved rightward in FIG. 15 to reach the second lateral position (see, FIG. 16). Thereafter, the second wafer holding part 21b having been moved rightward is moved leftward to return to the second lowered position (see, FIG. 17). During this movement, the first wafer holding part 21a is stopped, with holding the wafer W together with the bus hand 50. In this manner, the second wafer holding part 21b is continuously reciprocated between the second lowered position and the second lateral position. The reciprocating number of the second wafer holding part 21b between the second lowered position and the second lateral position is not limited to one, but may be more than one.

While the second wafer holding part 21b is being continuously moved between the second lowered position and the second lateral position, the control device 44 makes the vibrator 40 ultrasonically vibrate (a 23rd step). Thus, the ultrasonic vibration can be propagated to the area of the wafer W, which has been blocked by the second wafer holding part 21b.

Figure 12:
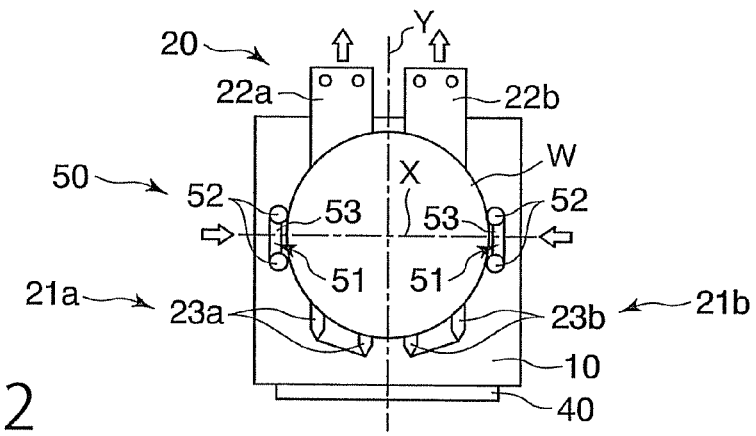
FIG. 12 is a view showing that the wafer is transferred from the bus hand to the wafer board, in the ultrasonic cleaning method in the first embodiment of the present invention.

Then, the second wafer holding part 21b is elevated from the second lowered position to return to the second holding position for holding the wafer W (a 24th step, see FIG. 12). In this case, based on a control signal from the control device 44, the elevating and driving part 27b is driven such that the second wafer holding part 21b is elevated. Thus, the first wafer holding part 21a and the second wafer holding part 21b are located at substantially the same height, so that the wafer W is engaged with the holding groove 25b of the holding rod 23b so as to be held by the second wafer holding part 21b. In this manner, the wafer W is held by the bus hand 50, the first wafer holding part 21a and the second wafer holding part 21b. At this time, the second wafer holding part 21b is located at the second holding position for holding the wafer W.

After that, similarly to the second wafer holding part 21b, the first wafer holding part 21a is laterally moved, and the ultrasonic cleaning of the wafer W is carried out.

In this case, the first wafer holding part 21a is lowered from the position at which the wafer W is held (a 25th step). Namely, based on a control signal from the control device 44, the elevating and driving part 27a is driven such that the first wafer holding part 21a is lowered. Thus, the wafer W is held by the bus hand 50 and the second wafer holding part 21b, and the first wafer holding part 21a comes away from the wafer W. At this time, the first wafer holding part 21a is located at the first lowered position located below the first holding position.

Then, the first wafer holding part 21a is continuously moved between the first lowered position and the first lateral position (a 26th step). In this case, based on a control signal from the control device 44, the lateral-movement driving part 30a is driven such that the first wafer holding part 21a is moved leftward in FIG. 15 to reach the first lateral position. Thereafter, the first wafer holding part 21a having been moved leftward is moved rightward to return to the first lowered position. During this movement, the second wafer holding part 21b is stopped, with holding the wafer W together with the bus hand 50. In this manner, the first wafer holding part 21a is continuously reciprocated between the first lowered position and the first lateral position. The reciprocating number of the first wafer holding part 21a between the first lowered position and the first lateral position is not limited to one, but may be more than one.

While the first wafer holding part 21a is being continuously moved between the first lowered position and the first lateral position, the control device 44 makes the vibrator 40 ultrasonically vibrate (a 27th step). Thus, the ultrasonic vibration can be propagated to the area of the wafer W, which has been blocked by the first wafer holding part 21a.

Then, the first wafer holding part 21a is elevated from the first lowered position to return to the holding position for holding the wafer W (a 28th step, see FIG. 12). In this case, based on a control signal from the control device 44, the elevating and driving part 27a is driven such that the first wafer holding part 21a is elevated. Thus, the first wafer holding part 21a and the second wafer holding part 21b are located at substantially the same height, so that the wafer W is engaged with the holding groove 25a of the holding rod 23a so as to be held by the first wafer holding part 21a. In this manner, the wafer W is held by the bus hand 50, the first wafer holding part 21a and the second wafer holding part 21b. At this time, the first wafer holding part 21a is located at the first holding position for holding the wafer W.

Then, a rinse process of the wafer W in the cleaning tank 10 is carried out (a 29th step). In this case, the chemical liquid in the cleaning tank 10 is discharged and a deionized water is supplied thereto. Then, similarly to the aforementioned 21st to 28th steps, the ultrasonic vibration is propagated to the cleaning liquid, while the first wafer holding part 21a or the second wafer holding part 21b are moved.

Following thereto, the wafer W is unloaded from the cleaning tank 10.

According to the above embodiment, the wafer W, which is immersed in the cleaning liquid in the cleaning tank 10 and is held by the first wafer holding part 21a and the second wafer holding part 21b of the wafer board 20, is held by the bus hand 50 disposed in the cleaning tank 10 and the first wafer holding part 21a. Thereafter, the second wafer holding part 21b is moved from the second holding position to the second lowered position. Then, the second wafer holding part 21b is continuously moved between the second lowered position and the second lateral position, and is then returned to the second holding position. Then, after the wafer W has been held by the bus hand 50 and the second wafer holding part 21b, the first wafer holding part 21a is moved from the first holding position to the first lowered position. Thereafter, the first wafer holding part 21a is continuously moved between the first lowered position and the first lateral position, and is then returned to the first holding position. While the first wafer holding part 21a is being moved between the first lowered position and the first lateral position, and while the second wafer holding part 21b is being moved between the second lowered position and the second lateral position, the control device 44 makes the vibrator 40 ultrasonically vibrate. Thus, the ultrasonic vibration from the vibrator 40 can be propagated to the areas of the wafer W, which are to be held by the wafer holding parts 21a and 21b (the areas of the wafer W, which are to be blocked by the wafer holding parts 21a and 21b), and the ultrasonic vibration can be uniformly propagated to all the areas of the wafer W. Therefore, all the areas of the wafer W can be ultrasonically cleaned uniformly.

According to the above embodiment, when the wafer W is ultrasonically cleaned, the wafer W is held by the bus hand 50 and one of the wafer holding parts of the wafer board 20. Thus, the wafer W can be stably held.

Similarly to the first embodiment, the aforementioned second embodiment can be variously modified within the scope of the present invention.

In particular, in the second embodiment, the vibrator 40 is made to ultrasonically vibrate, while the second wafer holding part 21b is being moved between the second lowered position and the second lateral position, and while the first wafer holding part 21a is being moved between the first lowered position and the first lateral position. However, not limited thereto, when the first wafer holding part 21a and the second wafer holding part 21b having reached the first lateral position and the second lateral position are stopped thereat for a predetermined period, the control device 44 operate the vibrator 40 such that the vibrator 40 is made to ultrasonically vibrate, only when the first wafer holding part 21a is stopped at the first lateral position and when the second wafer holding part 21b is stopped at the second lateral position. That is to say, the control device 44 may make the vibrator 40 ultrasonically vibrate in the following manner. Namely, after the wafer W has been held by the bus hand 50 and the first wafer holding part 21a, the second wafer holding part 21b is moved from the second holding position to the second lateral position, and is then returned to the second holding position so that the wafer W is held by the bus hand 50 and the second wafer holding part 21b. After that, the first wafer holding part 21a is moved from the first holding position to the first lateral position, and is then returned to the first holding position. The control device 44 may make the vibrator 40 ultrasonically vibrate, when the first wafer holding part 21a is located at least at the first lateral position, and when the second wafer holding part 21b is located at least at the second lateral position. Also in this case, the ultrasonic vibration from the vibrator 40 can be propagated to the areas of the wafer W, which are to be held by the wafer holding parts 21a and 21b (the areas of the wafer W, which are to be blocked by the wafer holding parts 21a and 21b), and the ultrasonic vibration can be uniformly propagated to all the areas of the wafer W.

Third Embodiment

Next, a third embodiment of the present invention is described with reference to FIGS. 18 to 28. FIGS. 18 to 28 are views explaining an ultrasonic cleaning apparatus in the third embodiment, an ultrasonic cleaning method in the third embodiment, and a storage medium storing a computer program for executing the ultrasonic cleaning method.

The third embodiment shown in FIGS. 18 to 28 mainly differs from the first embodiment shown in FIGS. 1 to 14 in that, the first wafer holding part and the second wafer holding part of the wafer board can hold a wafer independently from each other. The other structures of the third embodiment are substantially the same with those of the first embodiment. In FIGS. 18 to 28, the same parts as those of the first embodiment shown in FIGS. 1 to 14 are indicated by the same reference numbers, and detailed description thereof is omitted.

Figure 18:
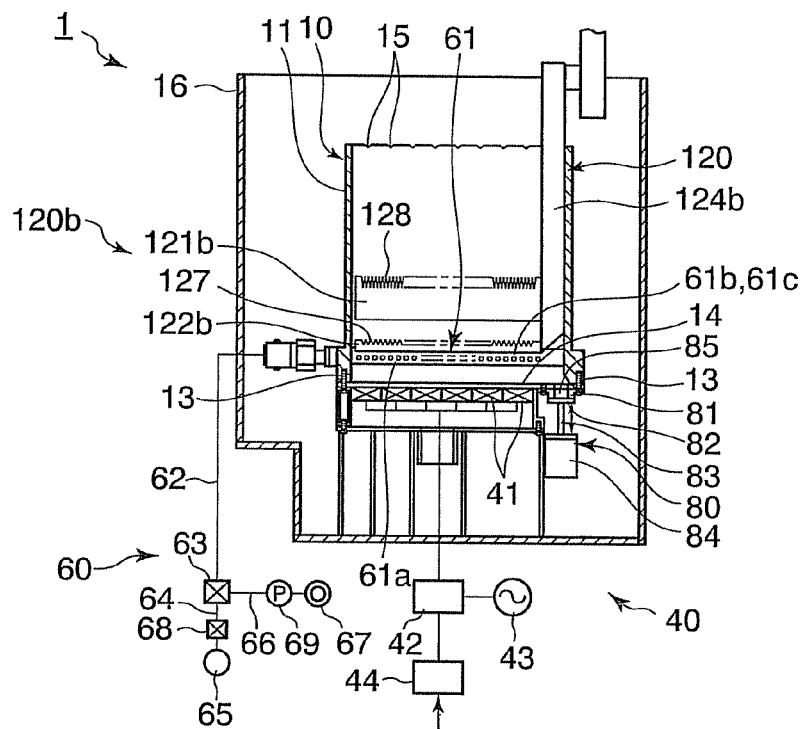
FIG. 18 is a view showing the ultrasonic cleaning apparatus in a third embodiment of the present invention.

As shown in FIG. 18, an ultrasonic cleaning apparatus 1 includes: a cleaning tank 10 configured to store a cleaning liquid; and a wafer board (an object-to-be-processed holder) 120 which can be inserted into the cleaning tank 10, the wafer board 120 being configured to hold a wafer W and to immerse the wafer W into the cleaning liquid.

Figure 19:
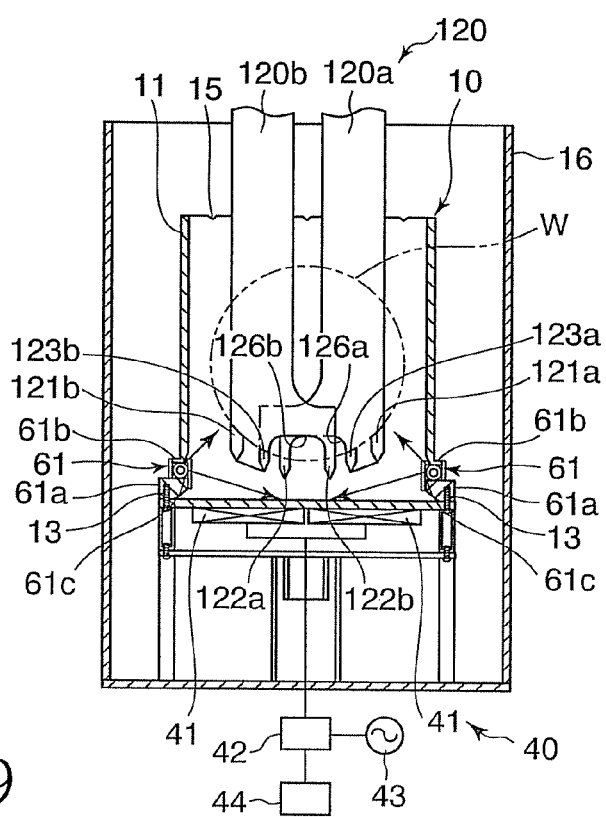
FIG. 19 is a side sectional view of FIG. 18.
Figure 20:
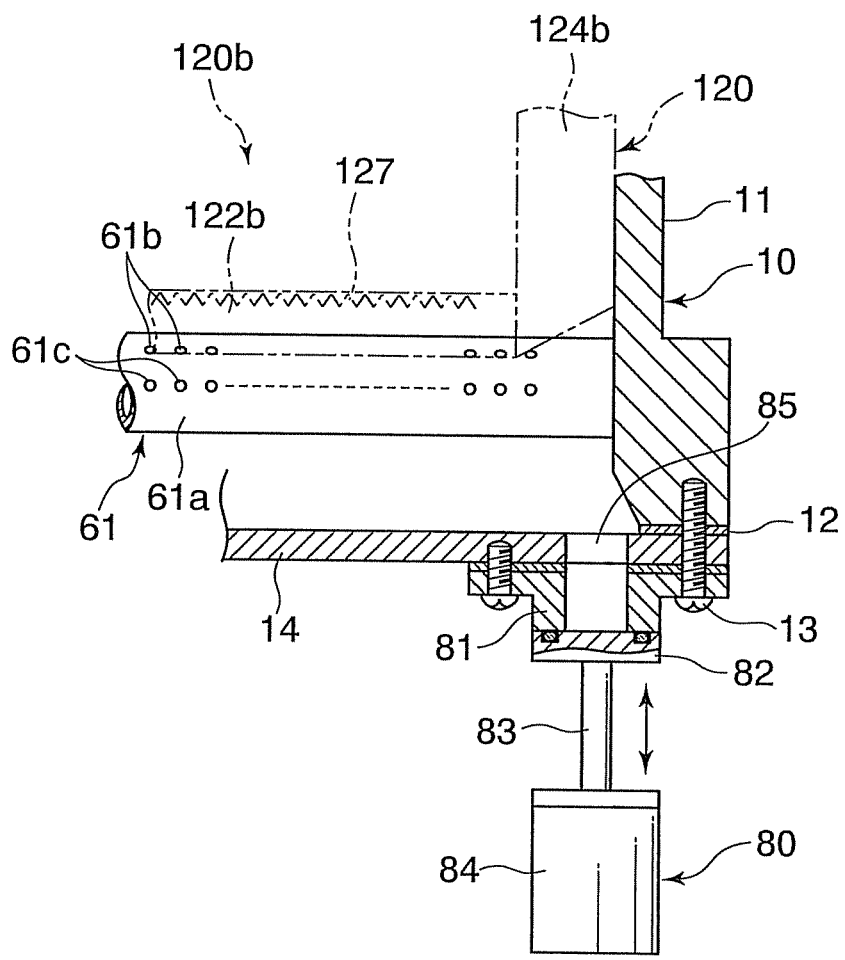
FIG. 20 is a view showing an exhaust valve mechanism, in the third embodiment of the present invention.
Figure 21:
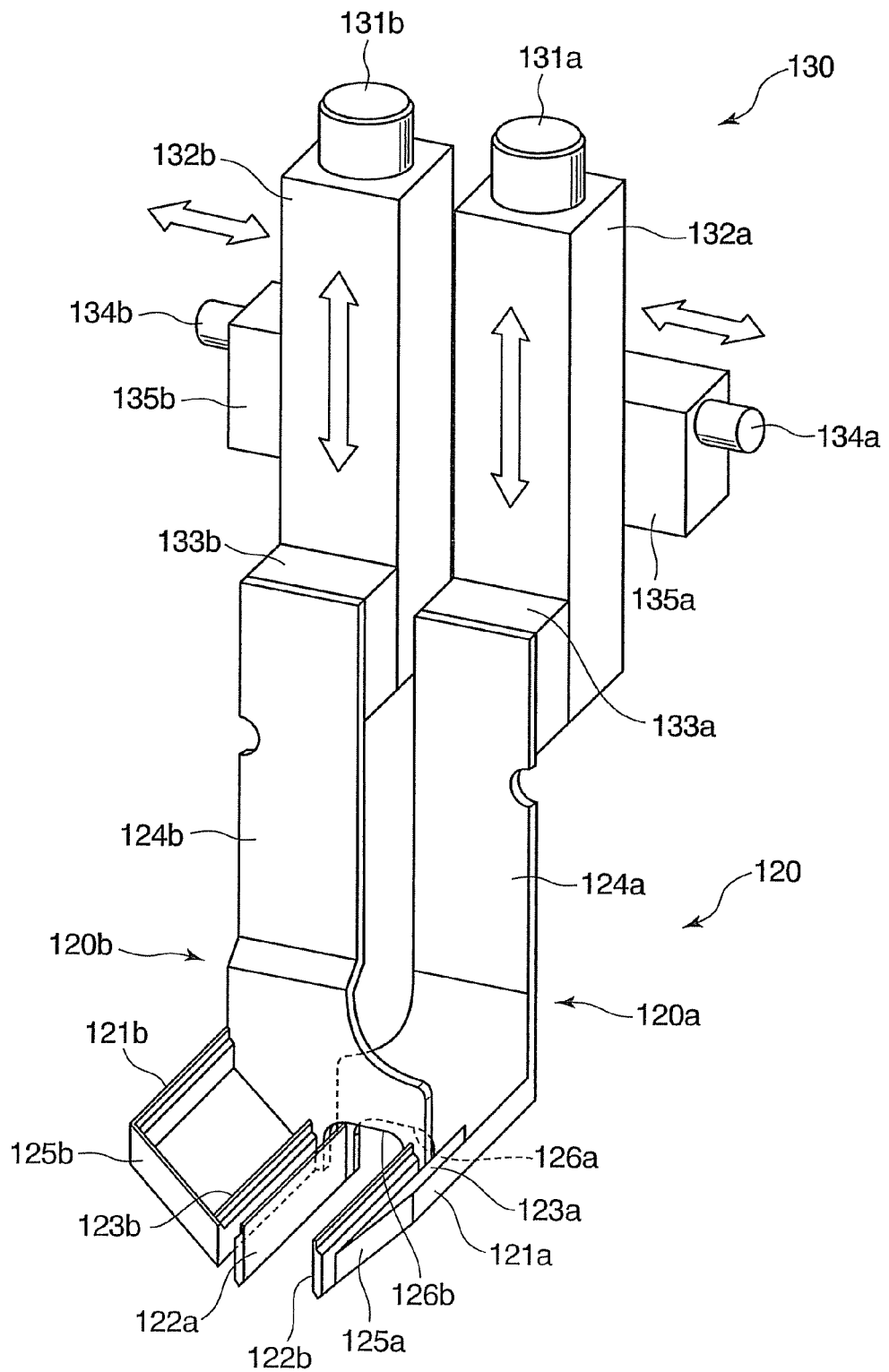
FIG. 21 is a view showing a structure of a wafer board, in the third embodiment of the present invention.

As shown in FIGS. 19 and 21, the wafer board 120 includes a first wafer holding part (a first object-to-be-processed holding part) 120a and a second wafer holding part (a second object-to-be-processed holding part) 120b which are symmetrically arranged in a plan view shown in FIG. 19, with respect to a vertical axis line X (see, FIGS. 23 to 28) passing the center of the wafer W. The first and second wafer holding parts 120a and 120b can be moved separately from each other.

The first wafer holding part 120a and the second wafer holding part 120b respectively include first holding rods 121a and 121b that are horizontally extended, and second holding rods 122a and 122b. The second holding rods 122a and 122b are in parallel with the first holding rods 121a and 121b, and are arranged oppositely to the first holding rods 121a and 121b with respect to the vertical axis line X of the wafer W. As shown in FIGS. 18, 19 and 21, the first holding rods 121a and 121b are located above the second holding rods 122a and 122b (and above the below-described third holding rods 123a and 123b).

The second holding rod 122a of the first wafer holding part 120a is located between the first holding rod 121b and the second holding rod 122b of the second wafer holding part 120b. In this case, the second holding rod 122b of the second wafer holding part 120b is located between the first holding rod 121a and the second holding rod 122a of the first wafer holding part 120a. Namely, the respective second holding rods 122a and 122b are located to cross each other.

The third holding rod 123a is disposed between the first holding rod 121a and the second holding rod 122a of the first wafer holding part 120a, to be more specific, between the first holding rod 121a and the second holding rod 122b of the second wafer holding part 120b. The third wafer holding rod 123a is extended in parallel with the first holding rod 121a and the second holding rod 122a, and is configured to hold a wafer W together with the first holding rod 121a and the second holding rod 122a.

Similarly, the third holding rod 123b is disposed between the first holding rod 121b and the second holding rod 122b of the second wafer holding part 120b, to be more specific, between the first holding rod 121b and the second holding rod 122a of the first wafer holding part 120a. The third holding rod 123b is extended in parallel with the first holding rod 121b and the second holding rod 122b, and is configured hold the wafer W together with the first holding rod 121b and the second holding rod 122b. As shown in FIG. 21, the first holding rod 121b is located above the second holding rod 122b and the third holding rod 123b.

A substantially vertically extending base part 124a is joined to proximal ends of the respective holding rods 121a, 122a and 123a of the first wafer holding part 120a, and a joint member 125a is joined to distal ends of the first holding rod 121a and the third holding rod 123a. Similarly, a substantially vertically extending base part 124b is joined to proximal ends of the respective holding rods 121b, 122b and 123b of the second wafer holding part 120b, and a joint member 125b is joined to distal ends of the first holding rod 121b and the third holding rod 123b. A distal end side (lower side) of the base part 124b of the second wafer holding part 120b has a stepped shape to be closer to the wafer W. Thus, the respective second wafer holding rods 122a and 122b are joined to the respective base parts 124a and 124b, without contacting each other. In addition, in the base part 124a of the first wafer holding part 120a, a recess 126a is formed between the second holding rod 122a and the third holding rod 123a. Similarly, in the base part 124b of the second wafer holding part 120b, a recess 126b is formed between the second holding rod 122b and the third holding rod 123b. A gap between the recess 126b and the second holding rod 122a prevents the base part 124b of the second wafer holding part 120b from being contacting the second holding rod 122a of the first wafer holding part 120a, when the second wafer holding part 120b is lowered from a second holding position to a second lowered position, and the first wafer holding part 120a is elevated, which is described below.

In this manner, the first wafer holding part 120a and the second wafer holding part 120b can hold a plurality of (e.g., fifty) wafers W independently from each other.

Figure 22A:
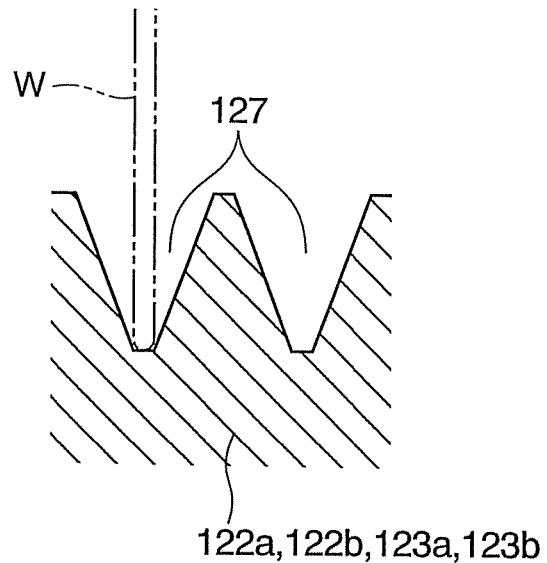
FIG. 22A is a view showing V-shaped grooves formed in a second holding rod and a third holding rod in the third embodiment of the present invention.

As shown in FIG. 22A, the second holding rods 122a and 122b and the third holding rod 123a and 123b are provided with a plurality of V-shaped grooves 127 each having a V-shaped cross-section engageable with a wafer W. The second holding rods 122a and 122b and the third holding rods 123a and 123b are located below the first holding rods 121a and 121b. Thus, the V-shaped groove 127 can bear a load of the wafer W, whereby generation of foreign matters such as particles can be prevented.

Figure 22B:
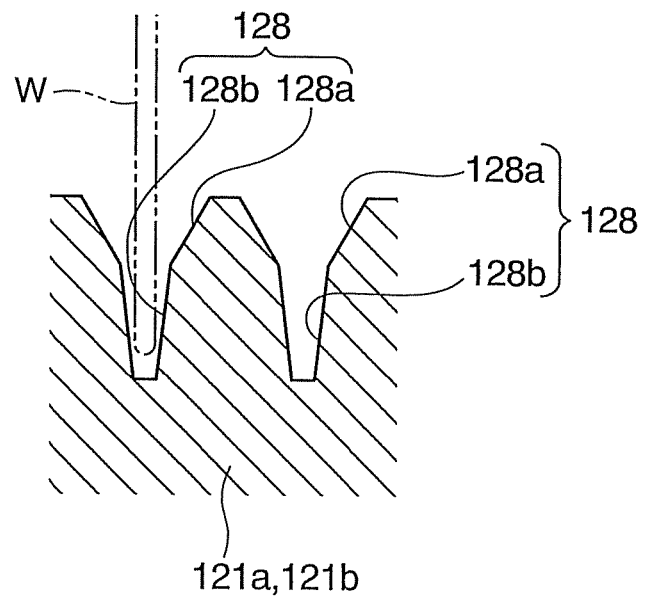
FIG. 22B is a view showing Y-shaped grooves formed in a first holding rod in the third embodiment of the present invention.
Figure 23:
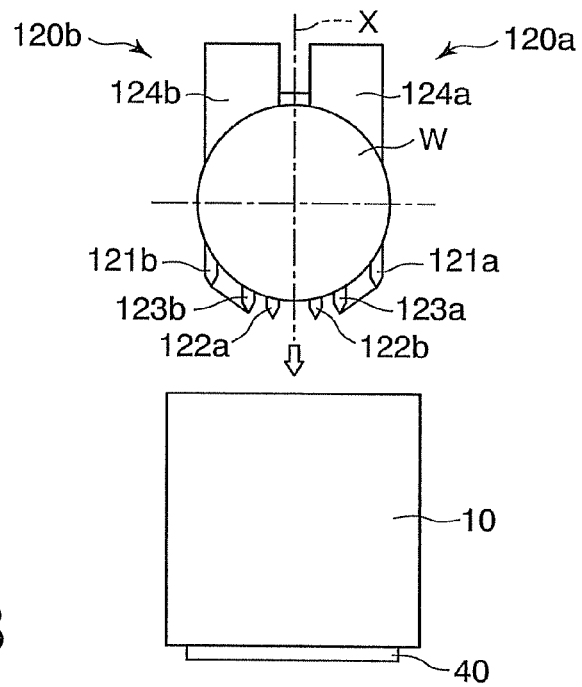
FIG. 23 is a view showing that a wafer is inserted into a cleaning tank, in the ultrasonic cleaning method in the third embodiment of the present invention.
Figure 24:
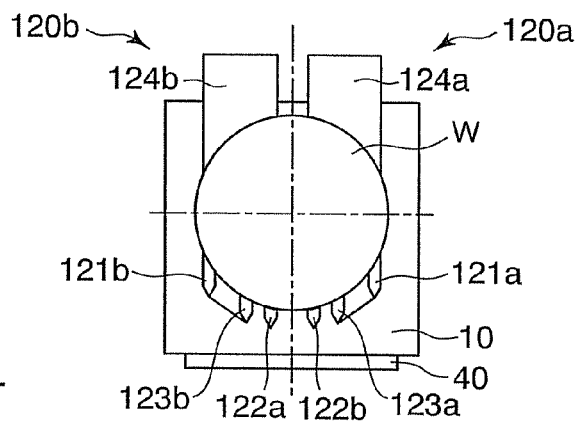
FIG. 24 is a view showing that the wafer is immersed in a cleaning liquid in the cleaning tank, in the ultrasonic cleaning method in the third embodiment of the present invention.

As shown in FIG. 22B, the first holding rods 121a and 121b are provided with a plurality of Y-shaped grooves 128 each having a Y-shaped cross-section engageable with a wafer W. The Y-shaped groove 128 is composed of an opening-side tapered surface 128a having a larger inclination angle with respect to a wafer W to be engaged, and a bottom-side tapered surface 128b disposed near to the bottom side than the opening-side tapered surface 128a. The bottom-side tapered surface 128b has a relatively smaller inclination angle with respect to the wafer W to be engaged and a narrower groove width, whereby the Y-shaped groove 128 has a Y-shaped cross section. By engaging a wafer W with the Y-shaped groove 128, the wafer W is engaged with the bottom-side tapered surface 128b of a narrower groove width, so that the wafer W can be reliably engaged. Since the Y-shaped groove 128 is located above the V-shaped groove 127 to which the load is applied, falling down of the wafer W can be efficiently prevented. Thus, the wafer board 120 can stably hold the wafers W in a vertically standing condition.

The respective parts of the wafer board 120 are made of quartz that is excellent in chemical resistance, and are coated with Teflon or SiC (silicon carbide).

As shown in FIG. 21, joined to the wafer board 120 is a driving apparatus 130 configured to elevate and lower the wafer board 120. Namely, the driving apparatus 130 includes: elevating and driving parts 131a and 131b respectively configured to elevate and lower the first wafer holding part 120a and the second wafer holding part 120b; and elevating-and-driving force transmitting parts 132a and 132b respectively joined between the elevating and driving parts 131a and 131b and base parts 124a and 124b, the elevating-and-driving force transmitting parts 132a and 132b being configured to transmit driving forces of the elevating and driving parts 131a and 131b. The elevating-and-driving force transmitting parts 132a and 132b are respectively joined to the base parts 124a and 124b via adapters 133a and 133b. Thus, the first wafer holding part 120a and the second wafer holding part 120b can be moved (elevated and lowered) separately from each other. By using the respective elevating and lowering parts 131a and 131b, a positional relationship between the respective first wafer holding part 120a and the second wafer holding part 120b can be adjusted.

The control device 44 (see, FIGS. 18 and 19) in this embodiment are connected to the respective elevating and driving parts 131a and 131b. Thus, based on a control signal from the control device 44, the elevating and driving parts 131a and 131b are configured to synchronically lower the first wafer holding part 120a and the second wafer holding part 120b so as to insert wafers W into the cleaning tank 10 and to immerse the wafers W into a cleaning liquid, and are configured to synchronically elevate the first wafer holding part 120a and the second wafer holding part 120b so as to unload the wafers W from the cleaning tank 10.

The first wafer holding part 120a are configured to be capable of being substantially vertically moved (elevated and lowered) by the driving apparatus 130 in the cleaning tank 10 between a first holding position for holding a wafer W, and a lowered position located slightly below the first holding position. Similarly, the second wafer holding part 120b can be substantially vertically moved by the driving apparatus 130 in the cleaning tank 10 between a second holding position for holding a wafer W, and a second lowered position located slightly below the second wafer holding position. Thus, based on a control signal from the control device 44, the first wafer holding part 120a is configured to be moved by the elevating and driving part 131a between the first holding position and the first lowered position, and the second wafer holding part 120b is configured to be moved by the elevating and driving part 131b between the second holding position and the second lowered position.

Further, the first wafer holding part 120a is configured to be capable of being substantially horizontally moved between the first lowered position and a first lateral position located laterally to the first lowered position. Namely, the first wafer holding part 120a can be moved rightward in FIG. 19 up to a position at which the second holding rod 122a is close to the second holding rod 122b of the second wafer holding part 120b. Similarly, the second wafer holding part 120b can be substantially horizontally moved between the second lowered position and a second lateral position located laterally to the second lowered position. Namely, the second wafer holding part 120b can be moved leftward in FIG. 19 up to a position at which the second holding rod 122b is close to the second holding rod 122a of the first wafer holding part 120a. Thus, the first wafer holding part 120a and the second wafer holding part 120b are configured to be also substantially horizontally movable separately from each other.

The driving apparatus 130 joined to the wafer board 120 is configured to move the first wafer holding part 120a and the second wafer holding part 120b between the respective lowered positions and the respective lateral position. That is to say, the driving apparatus 130 includes: a lateral-movement driving part 134a configured to move the first wafer holding part 120a between the first lowered position and the first lateral position; and a lateral driving-force transmitting part 135a joined between the lateral-movement driving part 134a and the elevate-and-driving force transmitting part 132a, the lateral driving-force transmitting part 135a being configured to transmit a driving force of the lateral-movement driving part 134a. Similarly, the driving apparatus 130 includes: a lateral-movement driving part 134b configured to move the second wafer holding part 120b between the second lowered position and the second lateral position; and a lateral driving-force transmitting part 135b joined between the lateral-movement driving part 134b and the elevate-and-driving force transmitting part 132b, the lateral driving-force transmitting part 135 being configured to transmit a driving force of the lateral-movement driving part 134b.

The control device 44 is connected to the respective lateral-movement driving parts 134a and 134b. Thus, based on a control signal from the control device 44, the first wafer holding part 120a and the second wafer holding part 120b are respectively configured to be moved between the respective lowered positions and the respective lateral position.

The control device 44 controls the driving apparatus 130 such that, after a wafer W held by the first wafer holding part 120a and the second wafer holding part 120b has been immersed into the cleaning liquid in the cleaning tank 10, the first wafer holding part 120a is moved from the first holding position for holding the wafer W to the first lateral position via the first lowered position, and that the first wafer holding part 120a is then returned to the first holding position via the first lowered position. The first wafer holding part 120a having returned to the first holding position holds the wafer W together with the second wafer holding part 120b. After that, the control device 44 controls the driving apparatus 130 such that the second wafer holding part 120b is moved from the second holding position for holding the wafer W to the second lateral position via the second lowered position, and that the second wafer holding part 120b is then returned to the second holding position via the second lowered position.

The control device 44 controls the ultrasonic oscillator 42 such that the vibrator 40 is made to ultrasonically vibrate, while the first wafer holding part 120a is being moved between the first lowered position and the first lateral position, and while the second wafer holding part 120b is being moved between the second lowered position and the second lateral position. Thus, the ultrasonic vibration from the vibrator 40 can be propagated to the areas of the wafer W, which are to be held by the first wafer holding part 120a and the second wafer holding part 120b (the areas of the wafer W, which are to be blocked by the first wafer holding part 120a and the second wafer holding part 120b).

In this embodiment, the control device 44 includes a computer, and the computer executes a program previously stored in a storage medium 45, whereby the cleaning of the wafers W using the ultrasonic cleaning apparatus 1 can be performed.

Next, an operation of this embodiment as structured above, i.e., an ultrasonic cleaning method in this embodiment is described with reference to FIGS. 23 to 28.

Similarly to the first embodiment, after a cleaning liquid has been supplied to the cleaning tank 10 (the 1st step), wafers W held by the first wafer holding part 120*a* and the second wafer holding part 120*b* of the wafer board 120 are immersed into the cleaning liquid in the cleaning tank 10 (a 102nd step). In this case, a plurality of, e.g., fifty wafers W, which have been transported by a not-shown transport mechanism, are held by the first wafer holding part 120*a* and the second wafer holding part 120*b* of the wafer board 120, which are located at substantially the same height. In this case, wafers W are engaged with the V-shaped grooves 127 formed in the second holding rods 122*a* and 122*b* and the third holding rods 123*a* and 123*b*, and are engaged with the Y-shaped grooves 128 formed in the first holding rods 121*a* and 121*b*. Then, based on a control signal from the control device 44, the elevating and driving parts 131*a* and 131*b* are synchronically driven such that the first wafer holding part 120*a* and the second wafer holding part 120*b* are lowered so as to be inserted into the cleaning tank 10 (see, FIG. 23). Thus, the wafers W are immersed into the cleaning liquid (see, FIG. 24). At this time, the first wafer holding part 120*a* and the second wafer holding part 120*b* are located at the first holding position and the second holding position for holding the wafers W.

Then, with the wafers W being held by the second wafer holding part 120*b* of the wafer board 120, the first wafer holding part 120*a* is moved from the first holding position for holding the wafers W, to the first lateral position via the first lowered position. Thereafter, the first wafer holding part 120*a* is returned to the first holding position via the first lowered position.

Figure 25:
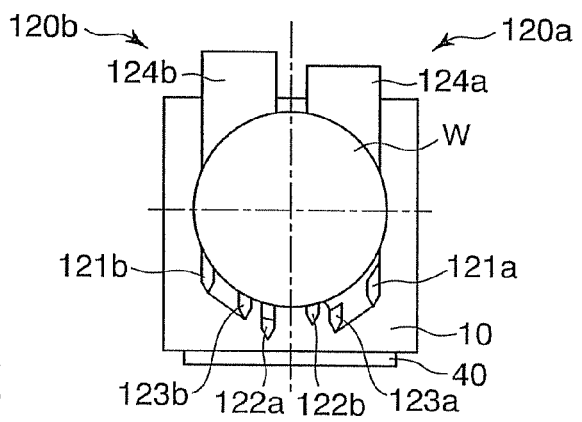
FIG. 25 is a view showing that a first wafer holding part is moved to a first lowered position, in the ultrasonic cleaning method in the third embodiment of the present invention.
Figure 26:
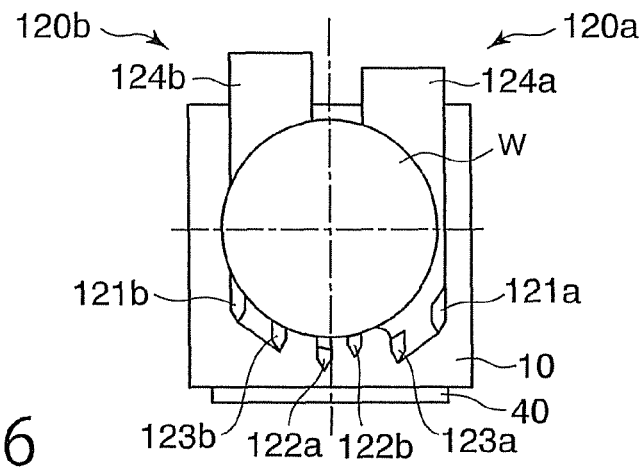
FIG. 26 is a view showing that the first wafer holding part is moved to a first lateral position, in the ultrasonic cleaning method in the third embodiment of the present invention.
Figure 27:
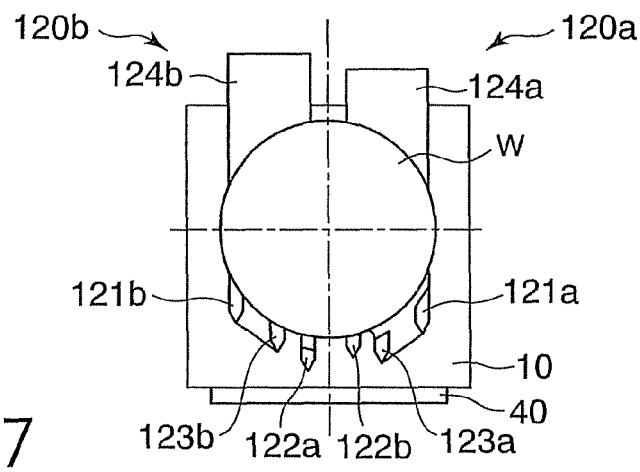
FIG. 27 is a view showing that the first wafer holding part is moved to the first lowered position, in the ultrasonic cleaning method in the third embodiment of the present invention.

In this case, as shown in FIG. 25, the first wafer holding part 120*a* of the wafer board 120 is lowered from the position at which the wafers W are held by the first wafer holding part 120*a*, and the second wafer holding part 120*b* are elevated with holding the wafers W (a 103rd step). At this time, the first wafer holding part 120*a* is located at the first lowered position located below the first holding position at which the wafers W have been held. Thus, the first wafer holding part 120*a* comes away from the wafers W, and the wafers W are held only by the second wafer holding part 120*b*. Therefore, the first wafer holding part 120*a* that subsequently moves between the first lowered position and the first lateral position can be prevented from contacting the wafers W.

Then, based on a control signal from the control device 44, the lateral-movement driving part 134*a* is driven such that the first wafer holding part 120*a* is continuously moved between the first lowered position and the first lateral position laterally located to the first holding position (a 104th step). Namely, the first wafer holding part 120*a* is moved rightward in FIG. 26 from the first lowered position to reach the first lateral position (see, FIG. 26), and is then moved leftward to return to the first lowered position (see, FIG. 27). During this movement, the second wafer holding part 120*b* is stopped with holding the wafers W. The reciprocating number of the first wafer holding part 120*a* between the first lowered position and the first lateral position is not limited to one, but may be more than one.

While the first wafer holding part 120*a* is being moved between the first lowered position and the first lateral position, the control device 44 makes the vibrator 40 ultrasonically vibrate (a 105th step). In this case, by sending a radiofrequency drive power (a drive signal) from the ultrasonic oscillator 42 to the vibrator 40 of the cleaning tank 10 so as to make the vibrator 40 ultrasonically vibrate, the wafers W are ultrasonically cleaned. In this manner, since the ultrasonic vibration is generated while moving the first wafer holding part 120*a*, the ultrasonic cleaning can be efficiently carried out for a short period of time.

Thus, while the first wafer holding part 120*a* is being continuously moved between the first lowered position and the first lateral position, the ultrasonic vibration from the vibrator 40 can be propagated to the area of each wafer W, which has been blocked by the first wafer holding part 120*a*.

Figure 28:
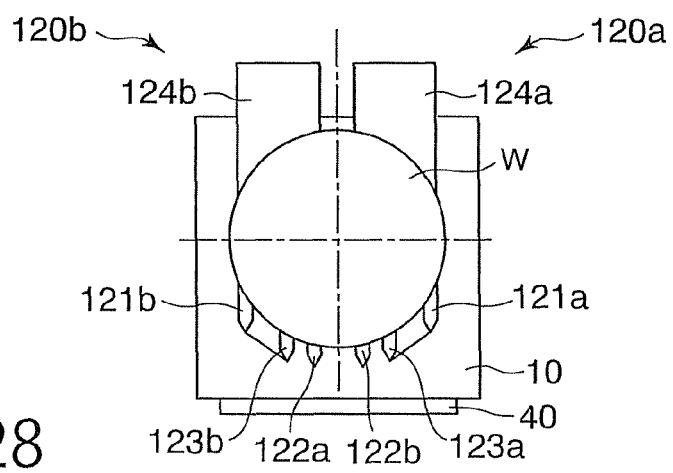
FIG. 28 is a view showing that the wafer is held by the first wafer holding part and the second wafer holding part, in the ultrasonic cleaning method in the third embodiment of the present invention.

Then, as shown in FIG. 28, the first wafer holding part 120*a* is elevated from the first lowered position to return to the first holding position for holding the wafers W, and the second wafer holding part 120*b* holding the wafers W is lowered to return to the second holding position (a 106th step). In this case, the first wafer holding part 120*a* and the second wafer holding part 120*b* are located at substantially the same height, whereby the wafers W are held by the first wafer holding part 120*a* and the second wafer holding part 120*b*.

Then, with the wafers W held by the first wafer holding part 120*a* of the wafer board 120, the second wafer holding part 120*b* is moved from the second holding position for holding the wafers W, to the second lateral position via the second lowered position. Thereafter, the second wafer holding part 120*b* is returned to the second holding position via the second lowered position.

In this case, the second wafer holding part 120*b* is lowered from the position at which the wafers are held by the second wafer holding part 120*b*, and the first wafer holding part 120*a* is elevated with holding the wafers W (a 107th step). At this time, the second wafer holding part 120*b* is located at the second lowered position located below the second holding position at which the wafers W have been held. Thus, the second wafer holding part 120*b* comes away from the wafers W, and the wafers W are held only by the first wafer holding part 120*a*.

Then, based on a control signal from the control device 44, the lateral-movement driving part 134*b* is driven such that the second wafer holding part 120*b* is continuously moved between the second lowered position and the second lateral position (a 108th step). Namely, the second wafer holding part 120*b* is moved leftward in FIG. 26 from the second lowered position to reach the second lateral position, and is then moved rightward to return to the second lowered position. The reciprocating number of the second wafer holding part 120*b* between the second lowered position and the second lateral position is not limited to one, but may be more than one.

While the second wafer holding part 120*b* is being moved between the second lowered position and the second lateral position, the control device 44 makes the vibrator 40 ultrasonically vibrate (a 109th step).

In this manner, while the second wafer holding part 120*b* is being continuously moved between the second lowered position and the second lateral position, the ultrasonic vibration from the vibrator 40 can be propagated to the area of each wafer W, which has been blocked by the second wafer holding part 120*b*.

Then, as shown in FIG. 29, the second wafer holding part 120*b* is elevated from the second lowered position to return to the second holding position for holding the wafers W, and the first wafer holding part 120*a* holding the wafers W is lowered to return to the first holding position (a 110th step). In this case, the first wafer holding part 120*a* and the second wafer holding part 120*b* are located at substantially the same height, whereby the wafers W are held by the first wafer holding part 120a and the second wafer holding part 120b.

Then, a rinse process of the wafers W in the cleaning tank 10 is carried out (a 111th step). In this case, the chemical liquid pump 69 is firstly stopped, so that the supply of the chemical liquid to the cleaning tank 10 is stopped. Then, the control device 44 opens the opening and closing valve 68 and actuates the selector valve 63 such that a deionized water is supplied form the deionized-water supply source 65 to the cleaning tank 10. Thereafter, similarly to the aforementioned 103rd to 110th steps, while moving the first wafer holding part 120a or the second wafer holding part 120b, the ultrasonic vibration is propagated to the cleaning liquid.

Then, the wafers W immersed in the cleaning liquid are unloaded (the 12th step). In this case, based on a control signal from the control device 44, the elevating and driving parts 131a and 131b are synchronically driven such that the first wafer holding part 120a and the second wafer holding part 120b by which the wafers W are held are elevated, so that the wafers W are unloaded from the cleaning tank 10. Thereafter, the wafers W are transported from the wafer board 120 to the not-shown transport mechanism.

By repeating the above steps, the wafers W can be sequentially, ultrasonically cleaned in the cleaning tank 10.

According to the above embodiment, the wafer board 120 that holds the wafers W immersed in the cleaning liquid in the cleaning tank 10 is composed of the first wafer holding part 120a and the second wafer holding part 120b which can be moved separately from each other. The first wafer holding part 120a and the second wafer holding part 120b can hold the wafers W independently from each other. Thus, after the wafers W held by the first wafer holding part 120a and the second wafer holding part 120b have been immersed into the cleaning liquid in the cleaning tank 10, the first wafer holding part 120a can be moved with the wafers W being held only by the second wafer holding part 120b, and the second wafer holding part 120b can be moved with the wafers W being held only by the first wafer holding part 120a. The vibrator 40 disposed on the bottom plate 14 of the cleaning tank 10 is made to ultrasonically vibrate, while the first wafer holding part 120a is being moved between the first lowered position and the first lateral position, and while the second wafer holding part 120b is being moved between the second lowered position and the second lateral position. Thus, the ultrasonic vibration from the vibrator 40 can be propagated to the areas of each wafer W, which have been blocked by the first wafer holding part 120a and the second wafer holding part 120b. Therefore, the ultrasonic vibration can be uniformly propagated to all the areas of the wafer W, whereby all the areas of the wafer W can be ultrasonically cleaned uniformly.

In the aforementioned embodiment, various modifications are possible within the scope of the present invention. Typical modifications are described herebelow.

That is to say, in the above embodiment, the first wafer holding part 120a and the second wafer holding part 120b respectively have the third holding rods 123a and 123b. However, not limited thereto, the first wafer holding part 120a and the second wafer holding part 120b may not have the third holding rods 123a and 123b, so that the wafers W are held only by the first holding rods 121a and 121b and the second holding rods 122a and 122b. Also in this case, since the second holding rods 122a and 122b are arranged oppositely to the first holding rods 121a and 121b with respect to the vertical axis line X passing the center of the wafer W, the first wafer holding part 120a and the second wafer holding part 120b can hold the wafers W independently from each other.

In addition, in the above embodiment, the third holding rod 123a of the first wafer holding part 120a is disposed between the first holding rod 121a of the first wafer holding part 120a and the second holding rod 122b of the second wafer holding part 120b, and the third holding rod 123b of the second wafer holding member 120b is disposed between the first holding rod 121b of the second wafer holding part 120b and the second holding rod 122a of the first wafer holding part 120a. However, not limited thereto, although not shown, the third holding rod 123a of the first wafer holding part 120a may be disposed between the second holding rod 122a of the first wafer holding part 120a and the second holding rod 122b of the second wafer holding part 120b, and the third holding rod 123b of the second wafer holding part 120b may be disposed between the second holding rod 122a and the third holding rod 123a of the first wafer holding part 120a.

In addition, in this embodiment, the second holding rods 122a and 122b and the third holding rods 123a and 123b are provided with the V-shaped grooves 127, and the first holding rods 121a and 121b are provided with the Y-shaped grooves 128. However, not limited thereto, the cross-sections of the grooves formed in the first holding rod 121a and 121b, the second holding rods 122a and 122b, and the third holding rods 123a and 123b are optional.

In addition, in the above embodiment, the control device 44 makes the vibrator 40 ultrasonically vibrate, while the first wafer holding part 120a and the second wafer holding part 120b are being moved between the respective lowered positions and the respective lateral positions. However, not limited thereto, the vibrator 40 may be made to ultrasonically vibrate, only while the first wafer holding part 120a and the second wafer holding part 120b are being moved from the respective lowered positions to the respective lateral positions. Alternatively, the vibrator 40 may be made to ultrasonically vibrate, only while the first wafer holding part 120a and the second wafer holding part 120b are being moved from the respective lateral positions to the respective lowered position. In both cases, the ultrasonic vibration from the vibrator 40 can be propagated to the areas of each wafer W, which are to be blocked by the first wafer holding part 120a and the second wafer holding part 120b.

In addition, in the above embodiment, the wafer holding part 120a and the second wafer holding part 120b of the wafer board 120 are continuously moved between the respective lowered positions and the respective lateral positions. However, not limited thereto, after the first wafer holding part 120a and the second wafer holding part 120b have been moved from the respective lowered positions to reach the respective lateral positions, the first wafer holding part 120a and the second wafer holding part 120b may be stopped thereat for a predetermined period, and thereafter moved from the respective lateral positions to the respective lowered positions. Also in this case, the ultrasonic vibration from the vibrator 40 can be propagated to the areas of each wafer W, which are to be blocked by the first wafer holding part 120a and the second wafer holding part 120b.

As described above, when the first wafer holding part 120a and the second wafer holding part 120b having reached the respective lateral positions are stopped thereat for a predetermined period, the vibrator 40 may be made to ultrasonically vibrate only when the first wafer holding part 120a and the second wafer holding part 120b are stopped at the respective lateral positions. That is to say, after the wafers W have been immersed into the cleaning liquid in the cleaning tank 10, the control device 44 may make the vibrator 40 ultrasonically vibrate, when the first wafer holding part 120a is moved from the first lowered position to the first lateral position so that the first wafer holding part 120 is located at the first lateral position, and the control device 44 may make the vibrator 40 ultrasonically vibrate, when the second wafer holding part 120b is moved from the second lowered position to the second lateral position so that the second wafer holding part 120b is located at the second lateral position. Also in this case, the ultrasonic vibration from the vibrator 40 can be propagated to the areas of each wafer W, which are to be blocked by the first wafer holding part 120a and the second wafer holding part 120b, and the ultrasonic vibration can be uniformly propagated to all the areas of the wafer W.

In addition, in the above embodiment, the first wafer holding part 120a of the wafer board 120 is moved from the first holding position for holding the wafers W to the first lateral position via the first lowered position, and the second wafer holding part 120b is elevated from the second holding position for holding the wafers W and is maintained at this position, while the first wafer holding part 120a is being moved. However, the movements of the first wafer holding part 120a and the second wafer holding part 120b are not limited thereto.

Specifically, after the wafers W held by the first wafer holding part 120a and the second wafer holding part 120b have been immersed into the cleaning liquid in the cleaning tank 10, the first wafer holding part 120a may be merely lowered from the first holding position for holding the wafers W, without elevating the second wafer holding part 120b. Namely, the movement of the second wafer holding part 120b is not limited, as long as the first wafer holding part 120a is lowered from the first holding position to the first lowered position in order to avoid interference of the first holding part 120a with the wafers W during the lateral movement of the first holding part 120a.

In addition, in the above embodiment, the first wafer holding part 120a and the second wafer holding part 120b are moved from the respective holding positions to the respective lateral positions via the respective lowered positions located below the respective holding positions, and are returned from the respective lateral positions to the respective holding positions via the respective lowered position. However, not limited thereto, the first wafer holding part 120a and the second wafer holding part 120b may be moved between the respective holding positions and the respective lateral positions without passing through the respective lowered positions. In this case, the drive control of the wafer holding parts 120a and 120b can be simplified.

In addition, in the above embodiment, the first wafer holding part 120a and the second wafer holding part 120b are sequentially moved, so that all the areas of the wafer W are uniformly cleaned. However, not limited thereto, by moving at least one of the wafer holding parts, the area of each wafer W, which has been blocked by the moved wafer holding part, can be reliably cleaned.

As described above, the ultrasonic cleaning apparatus 1 is equipped with the control device 44 including the computer. The respective components of the ultrasonic cleaning apparatus 1 are actuated by the control device 44, such that the cleaning of the wafers W is performed. The present invention also provides the storage medium 45 storing a program executable by the computer of the control device 44, in order to perform the cleaning of the wafers W with the use of the ultrasonic cleaning apparatus 1. The storage medium 45 may be a memory such as a ROM or a RAM, or the disc-shaped storage medium 45 such as a hard disc or a CD-ROM.

In the above description, the ultrasonic cleaning apparatus 1 of the present invention, the ultrasonic cleaning method, and the storage medium 45 storing the computer program for executing the ultrasonic cleaning method, are applied to the cleaning process of the semiconductor wafers W. However, not limited thereto, the present invention can be applied to cleaning of various substrates such as LCD substrates or CD substrates.

The invention claimed is:

1. An ultrasonic cleaning apparatus comprising:
a cleaning tank configured to store a cleaning liquid;
an object-to-be-processed holder that can be inserted into the cleaning tank, the object-to-be-processed holder being configured to hold an object to be processed and to immerse the object to be processed into the cleaning liquid;
a vibrator disposed on a bottom part of the cleaning tank;
an ultrasonic oscillator configured to make the vibrator ultrasonically vibrate;
a driving apparatus configured to laterally move the object-to-be-processed holder; and
a control device configured to control the ultrasonic oscillator and the driving apparatus;
wherein the object-to-be-processed holder includes a first object-to-be-processed holding part and a second object-to-be-processed holding part which can be moved separately and laterally from each other;
wherein each of the first object-to-be-processed holding part and the second object-to-be-processed holding part includes a first holding rod and a second holding rod, the second holding rod being in opposed arrangement to the first holding rod with respect to a vertical axis line passing a center of the object to be processed;
the second holding rod of the first object-to-be-processed holding part is disposed between the first holding rod of the second object-to-be-processed holding part and the second holding rod of the second object-to-be-processed holding part;
the second holding rod of the second object-to-be-processed holding part is disposed between the first holding rod of the first object-to-be-processed holding part and the second holding rod of the first object-to-be-processed holding part;
wherein the first object-to-be-processed holding part and the second object-to-be-processed holding part can hold the object to be processed independently from each other; and
the control device is configured to control the driving apparatus such that the first object-to-be-processed holding part and the second object-to-be-processed holding part of the object-to-be-processed holder are sequentially laterally moved, so that one of the first object to be processed holding part and the second object to be processed holding part is laterally moved with respect to the object to be processed held by the other, and the control device is configured to control the ultrasonic oscillator such that the vibrator is made to ultrasonically vibrate whereby the ultrasonic vibration from the vibrator is propagated to the object to be processed;
wherein the control device is configured to control the driving apparatus such that, after the object to be processed held by the first object-to-be-processed holding part and the second object-to-be-processed holding part has been immersed into the cleaning liquid in the cleaning tank, the first object-to-be-processed holding part is moved from a first holding position at which the object to be processed is held, to a first lateral position located laterally to the first holding position and is then returned to the first holding position, and that the second object-to-be-processed holding part is moved from a second holding position at which the object to be processed is held, to a second lateral position located laterally to the second holding position and is then returned to the second holding position, and the control device is configured to control the ultrasonic oscillator such that the vibrator is made to ultrasonically vibrate when the first object-to-be-processed holding part is located at least at the first lateral position and when the second object-to-be-processed holding part is located at least at the second lateral position, whereby the ultrasonic vibration from the vibrator is propagated to areas of the object to be processed, the areas having been held by the first object-to-be-processed holding part and the second object-to-be-processed holding part.

2. The ultrasonic cleaning apparatus according to claim 1, wherein each of the first object-to-be-processed holding part and the second object-to-be-processed holding part includes a third holding rod disposed between the first holding rod and the second holding rod, the third holding rod being configured to hold the object to be processed together with the first holding rod and the second holding rod.

3. The ultrasonic cleaning apparatus according to claim 2, wherein the third holding rod of the first object-to-be-processed holding part is disposed between the first holding rod of the first object-to-be-processed holding part and the second holding rod of the second object-to-be-processed holding part, and
the third holding rod of the second object-to-be-processed holding part is disposed between the first holding rod of the second object-to-be-processed holding part and the second holding rod of the first object-to-be-processed holding part.

4. The ultrasonic cleaning apparatus according to claim 2, wherein the second holding rods and the third holding rods of the first object-to-be-processed holding part and of the second object-to-be-processed holding part are provided with V-shaped grooves each having a V-shaped cross-section engageable with the object to be processed, and
the first holding rods of the first object-to-be-processed holding part and of the second object-to-be-processed holding part are provided with Y-shaped grooves each having a Y-shaped cross-section engageable with the object to be processed.

5. The ultrasonic cleaning apparatus according to claim 1, wherein the control device is configured to control the driving apparatus such that, when the first object-to-be-processed holding part is moved between the first holding position and the first lateral position, the first object-to-be-processed holding part passes through a first lowered position located below the first holding position, and that, when the second object-to-be-processed holding part is moved between the second holding position and the second lateral position, the second object-to-be-processed holding part passes through a second lowered position located below the second holding position.

6. The ultrasonic cleaning apparatus according to claim 5, wherein the control device is configured to control the ultrasonic oscillator such that the vibrator is also made to ultrasonically vibrate, while the first object-to-be-processed holding part is being moved between the first lowered position and the first lateral position, and while the second object-to-be-processed holding part is moved between the second lowered position and the second lateral position.

* * * * *